United States Patent
Hsiao et al.

(10) Patent No.: US 11,842,959 B2
(45) Date of Patent: Dec. 12, 2023

(54) METAL-INSULATOR-METAL STRUCTURE

(71) Applicant: Taiwan Semiconductor Manufacturing Co., Ltd., Hsinchu (TW)

(72) Inventors: Yuan-Yang Hsiao, Hsinchu (TW); Hsiang-Ku Shen, Hsinchu (TW); Dian-Hau Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/466,013

(22) Filed: Sep. 3, 2021

(65) Prior Publication Data

US 2021/0398896 A1 Dec. 23, 2021

Related U.S. Application Data

(62) Division of application No. 16/802,246, filed on Feb. 26, 2020, now Pat. No. 11,114,373.

(51) Int. Cl.
*H01L 23/522* (2006.01)
*H01L 21/768* (2006.01)
(Continued)

(52) U.S. Cl.
CPC ...... *H01L 23/5223* (2013.01); *H01L 21/0214* (2013.01); *H01L 21/31111* (2013.01);
(Continued)

(58) Field of Classification Search
CPC ............ H01L 23/5223; H01L 21/0214; H01L 21/31111; H01L 21/31144;
(Continued)

(56) References Cited

U.S. PATENT DOCUMENTS 9,000,584 B2 4/2015 Lin et al.
9,048,222 B2 6/2015 Hung et al.
(Continued)

FOREIGN PATENT DOCUMENTS

JP 2005142531 A 6/2005
KR 20060062364 A 6/2006
(Continued)

*Primary Examiner* — Patricia D Valenzuela
(74) *Attorney, Agent, or Firm* — HAYNES AND BOONE, LLP

(57) ABSTRACT

Semiconductor devices, integrated circuits and methods of forming the same are provided. In one embodiment, a semiconductor device includes a metal-insulator-metal structure which includes a bottom conductor plate layer including a first opening and a second opening, a first dielectric layer over the bottom conductor plate layer, a middle conductor plate layer over the first dielectric layer and including a third opening, a first dummy plate disposed within the third opening, and a fourth opening, a second dielectric layer over the middle conductor plate layer, and a top conductor plate layer over the second dielectric layer and including a fifth opening, a second dummy plate disposed within the fifth opening, a sixth opening, and a third dummy plate disposed within the sixth opening. The first opening, the first dummy plate, and the second dummy plate are vertically aligned.

20 Claims, 21 Drawing Sheets

(51) Int. Cl.
*H01L 21/02* (2006.01)
*H01L 21/311* (2006.01)
*H01L 23/528* (2006.01)
*H01L 49/02* (2006.01)
*H01L 21/3105* (2006.01)
*H01L 21/321* (2006.01)
*H01L 21/027* (2006.01)

(52) U.S. Cl.
CPC .. H01L 21/31144 (2013.01); H01L 21/76805 (2013.01); H01L 21/76843 (2013.01); H01L 21/76877 (2013.01); H01L 23/528 (2013.01); H01L 23/5226 (2013.01); H01L 28/60 (2013.01); H01L 21/0217 (2013.01); H01L 21/0271 (2013.01); H01L 21/02164 (2013.01); H01L 21/02167 (2013.01); H01L 21/02178 (2013.01); H01L 21/02189 (2013.01); H01L 21/31053 (2013.01); H01L 21/3212 (2013.01); H01L 21/7684 (2013.01); H01L 28/87 (2013.01)

(58) Field of Classification Search
CPC ......... H01L 21/76805; H01L 21/76843; H01L 21/76877; H01L 23/5226; H01L 23/528; H01L 28/60; H01L 21/02164; H01L 21/02167; H01L 21/0217; H01L 21/02178; H01L 21/02189; H01L 21/31053; H01L 21/3212; H01L 21/7684; H01L 23/5222; H01L 21/768; H01L 28/40; H01L 27/0805; H01L 28/87; H01L 21/0271

See application file for complete search history.

(56) References Cited

U.S. PATENT DOCUMENTS

| | | | |
|---|---|---|---|
| 9,048,233 | B2 | 6/2015 | Wu et al. |
| 9,064,879 | B2 | 6/2015 | Tung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 2005/0082639 | A1 | 4/2005 | Kikuta et al. |
| 2006/0118907 | A1 | 6/2006 | Park |
| 2014/0159200 | A1 | 6/2014 | Loke |
| 2015/0349254 | A1* | 12/2015 | Chang .................. H01L 45/146 257/528 |
| 2019/0165188 | A1* | 5/2019 | Chang ................. H01L 23/5223 |
| 2019/0259698 | A1 | 8/2019 | Takahashi et al. |
| 2020/0006183 | A1 | 1/2020 | Huang |
| 2020/0035779 | A1 | 1/2020 | Huang et al. |

FOREIGN PATENT DOCUMENTS

| | | |
|---|---|---|
| KR | 20070028392 A | 3/2007 |
| KR | 20100041220 A | 4/2010 |
| WO | 2005122245 A2 | 12/2005 |

* cited by examiner

METAL-INSULATOR-METAL STRUCTURE

PRIORITY DATA

This application is a divisional application of U.S. patent application Ser. No. 16/802,246, filed Feb. 26, 2020, the entirety of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

As the geometry size of IC devices decreases, passive devices that require large surface areas are moved to back-end-of-line (BEOL) structures. Metal-Insulator-Metal (MIM) capacitors are among examples of such passive devices. A typical MIM capacitor includes multiple conductor plate layers that are insulated from one another by multiple insulator layers. To provide good process tolerance and prevent etch loading, openings and dummy plates are formed in each of the conductor plate layers. These openings and dummy plates may reduce the effective area of the MIM capacitor. Therefore, although existing MIM structures and the fabrication process thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
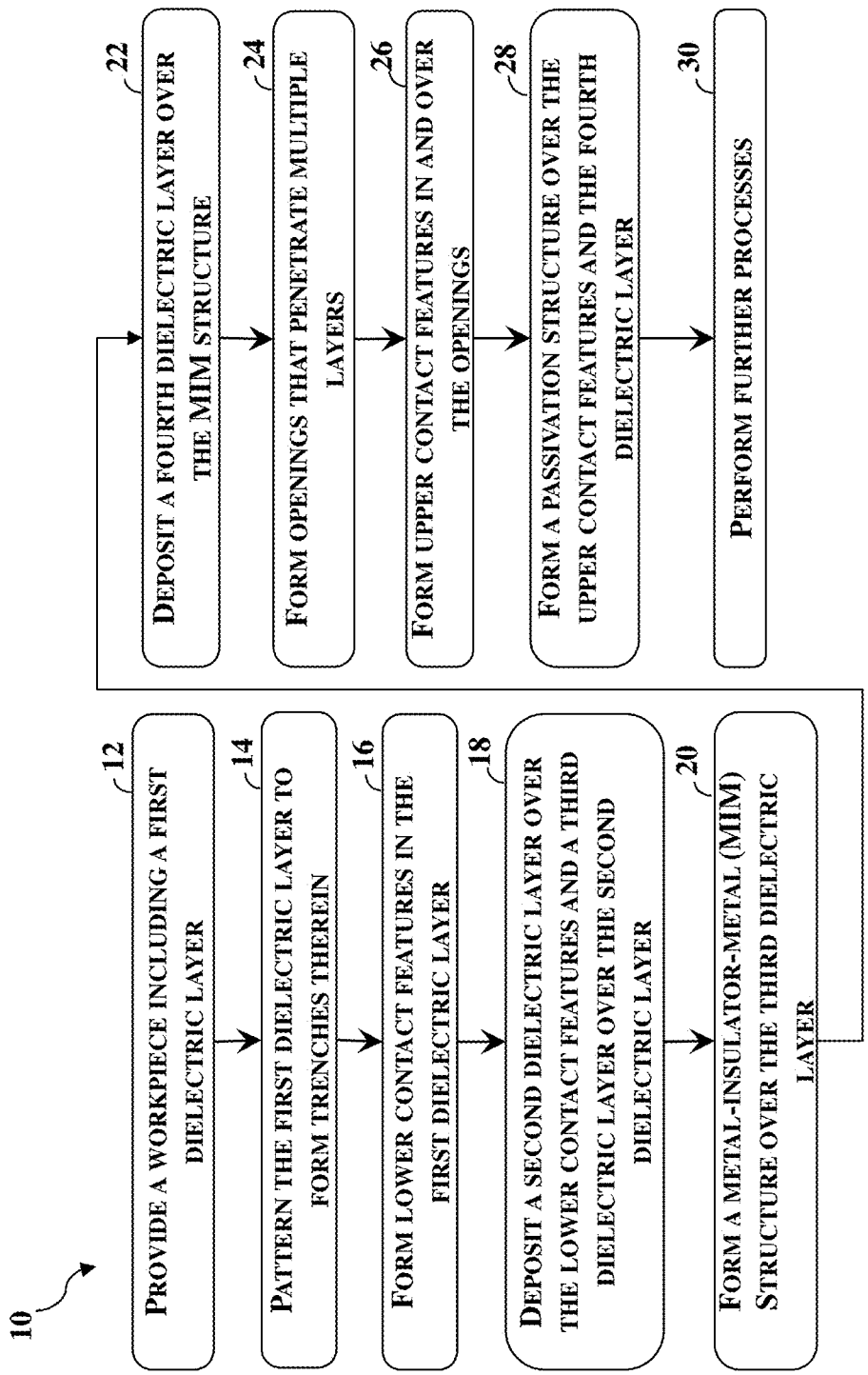
FIG. 1 is a flow chart of a method for fabricating a semiconductor device in accordance with embodiments of the present disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments, in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Metal-Insulator-Metal (MIM) capacitors have been widely used in functional circuits such as mixed signal circuits, analog circuits, Radio Frequency (RF) circuits, Dynamic Random Access Memories (DRAMs), embedded DRAMs, and logic operation circuits. In system-on-chip (SOC) applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. As its name suggests, an MIM capacitor includes a sandwich structure of interleaving metal layers and insulator layers. An example MIM capacitor includes a bottom conductor plate layer, a middle conductor plate layer over the bottom conductor plate layer, and a top conductor plate layer over the middle conductor plate, each of which is insulated from an adjacent conductor plate layer by an insulator layer. As an MIM capacitor is fabricated in a BEOL structure to have a larger surface area, its conductor plate layers extend over multiple lower contact features. Contact vias may be formed through the conductor plate layers to electrically couple the lower contact features to upper contact features, such as contact pads, for connection to external circuitry.

Contact vias may penetrate the conductor plate layers at least three scenarios. In the first scenario, a contact via extends through the conductor plate layers without electrically coupling to any of the conductor plate layers. The contact via in the first scenario may be for logic drive signals and may be referred to as a logic contact via. In the second scenario, a contact via extends through the conductor plate layers and is only electrically coupled to the middle conductor plate layer. As the contact via in the second scenario is electrically coupled to the middle conductor plate layer but electrically isolated from the top conductor plate layer and the bottom conductor plate layer, it may be referred to a middle plate (MP) contact via. In the third scenario, a contact via extends through the conductor plate layers and is only electrically coupled to top conductor plate layer and the bottom conductor plate. As the contact via in the second scenario is electrically coupled to the top conductor plate layer and the bottom conductor plate layer but is insulated from the middle conductor plate layer, it may be referred to a top plate-bottom plate (TPBP) contact via. The logic conduct via has nothing to do with operations of the MIM capacitor. On the contrary, the MP contact via and the TPMP contact via provide access to capacitance between the middle conductor plate, on the one hand, and the top conductor plate layer and the bottom conductor plate layer, on the other hand.

The conductor plate layers are patterned to ensure proper electrical coupling to and insulation from the respective contact vias. As a logic contact via is to pass through the conductor plate layers without coupling to any of them, an opening in each of the conductor plate layers is formed such that the openings are vertically aligned to form a passage way for the logic contact via. To build in process robustness and tolerance, each of the vertically aligned openings has a dimension greater than that of the via opening for the logic contact via. In instances where the openings and the via openings are circular in shape, each of the vertically aligned openings has a diameter greater than that of the via opening for the logic contact via. In addition, considering process variance that may cause misalignment of the supposedly vertically aligned opening, opening "enclosure" may be taken into consideration. Here, enclosure refers to enlargement of an opening to completely cover an adjacent opening. In some conventional technologies, an opening in the top conductor plate layer is made larger than an underlying opening in the middle conductor plate layer, and the opening in the middle conductor plate layer is made larger than an underlying opening in the bottom conductor plate layer. This configuration may be referred to as a top-down enclosure for openings. The same principle and technique may be applied to the via openings for the MP contact via and the TPBP contact via. As an MP contact via is to couple to the middle conductor plate layer and insulated from the top conductor plate layer and the bottom conductor plate layer, openings are form in the top conductor plate layer and the bottom conductor plate layer. Each of these openings has a dimension (e.g. a diameter) greater than that of the via opening of the MP contact via. The opening in the top conductor plate layer is made larger than the opening in the bottom conductor plate layer to prevent misalignment thereof. With respect to an TPBP contact via that is insulated from the middle conductor plate layer, an opening is formed in the middle conductor plate layer. This opening is made larger than the via opening for the TPBP contact via.

As can be seen from the foregoing descriptions, the via openings may be formed through different number of conductor plate layers. Formation of a logic contact via does not require etching through all three conductor plate layers because vertically aligned openings in the conductor plate layers have already been made. Formation of an MP contact via requires etching through one conductor plate layer—the middle conductor plate layer. Formation of an TPBP contact via requires etching through two conductor plate layers—the top conductor plate layer and the bottom conductor plate layer. This creates uneven etch loading when the via openings are etched in the same etch process. That is, the etching through the via opening for the logic contact via sees no conductor plate layer, the etching through the via opening for the MP contact via sees one conductor plate layer, and the etching through the via opening for the TPBP contact via sees two conductor plate layers. To address this issue, dummy plates are used to even out the uneven etch loading. Two dummy plates may be inserted in the openings in the bottom conductor plate layer and the middle conductor plate layer, respectively. One dummy plate may be inserted in the bottom conductor plate layer at the location where the MPC contact via is formed. With the insertion of the dummy plates, formation of the logic contact via, the MP contact via, and the TPBP contact via all involves etching through two conductor layers.

The insertion of dummy plates comes at a price of reduction in effective area of the MIM capacitor. As dummy plates are formed within the openings in the middle conductor plate layer and the bottom conductor plate layer, the openings are widened to enclose the dummy plates with proper spacing. Further, the dummy plate in the bottom conductor plate is made larger to areally enclose the dummy plate in the middle conductor plate to achieve bottom-up enclosure (i.e., the vertical projection area of the dummy plate in the bottom conductor plate layer being greater than vertical projection area of the dummy plate in the middle conductor plate layer). The bottom-up enclosure of dummy plates in the middle and bottom conductor plate layers, compounding with the top-down enclosure of openings described above, results in enlargement of openings and reduction in effective area of the MIM capacitor.

The present disclosure provides a method and a semiconductor device to increase the effective area of an MIM capacitor while maintaining or improving the process tolerance. In some embodiments, the method of the present disclosure implements top-down enclosure of openings, replaces dummy plates in the bottom conductor plate layer with dummy plates in the top conductor plate layer, and implements top-down enclosure of dummy plates. The semiconductor device fabricated using the methods of the present disclosure includes an MIM capacitor with a larger effective area. In some instances, the effective area of an MIM capacitor according to the present disclosure may be 25% more than an MIM capacitor fabricated using conventional methods.

The various aspects of the present disclosure will now be described in more detail with reference to the figures. In that regard, FIG. 1 is a flowchart illustrating a method 10 for fabricating a semiconductor device according to embodiments of the present disclosure. The method 10 is merely an example and is not intended to limit the present disclosure to what is explicitly illustrated in the method 10. Additional steps can be provided before, during, and after the method 10, and some steps described can be replaced, eliminated, or moved around for additional embodiments of the method. Not all steps are described herein in detail for reasons of simplicity. The method 10 is described below in conjunction with FIGS. 2-8 and 10-19, which are diagrammatic fragmentary cross-sectional views of the semiconductor device at different stages of fabrication according to embodiments of the present disclosure.

Figure 2:
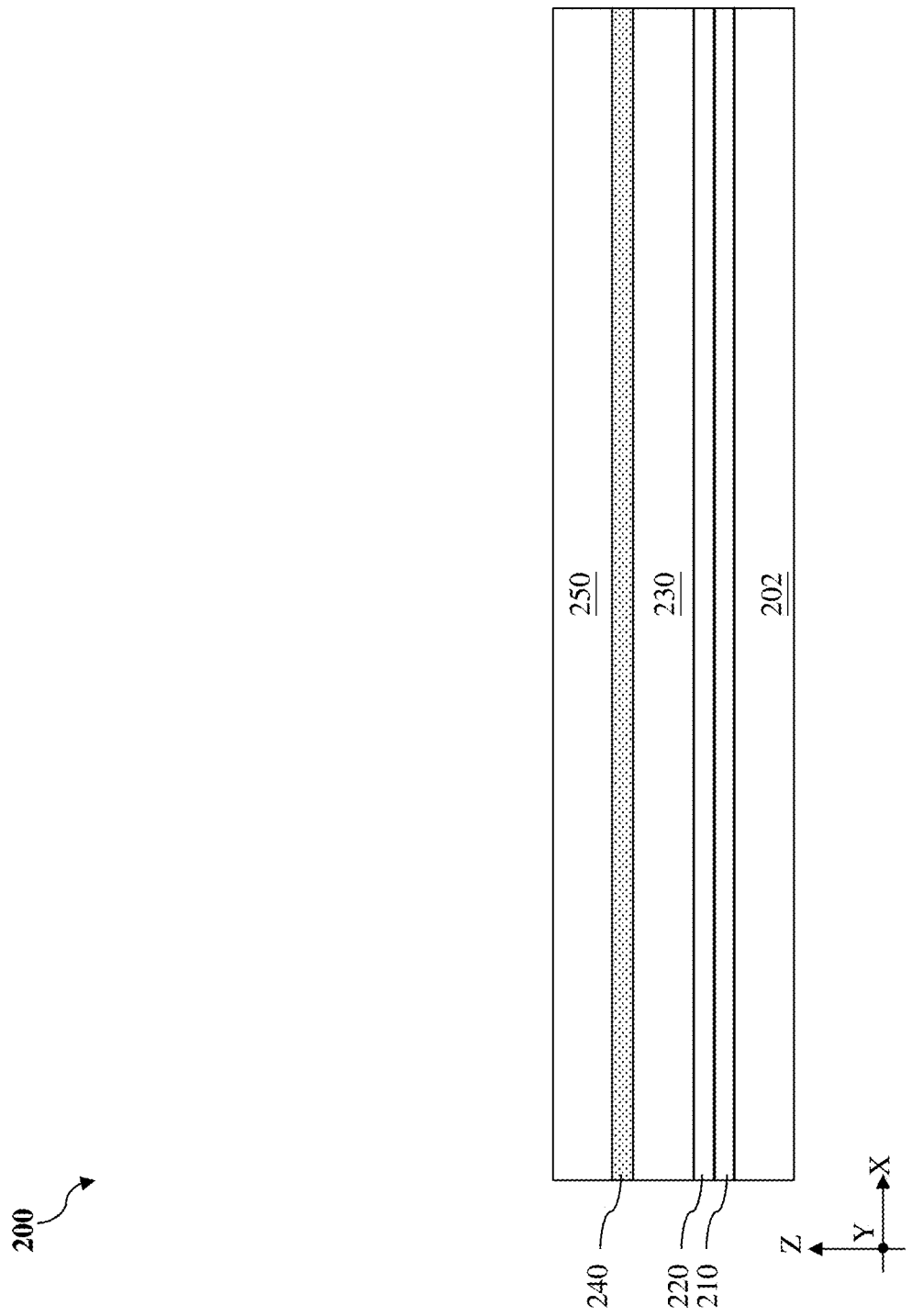
FIGS. 2-8 and 10-19 are cross-sectional views of a semiconductor device at various stages of fabrication according to embodiments of the present disclosure.

Referring to FIGS. 1 and 2, method 10 includes a block 12 where a workpiece 200 is provided. The workpiece 200 includes various layers already formed thereon. Because a semiconductor device will be formed from the workpiece 200, workpiece 200 may be referred to as semiconductor device 200 as the context requires. The workpiece 200 includes a substrate 202, which may be made of silicon or other semiconductor materials such as germanium. The substrate 202 also may include a compound semiconductor such as silicon carbide, gallium arsenic, indium arsenide, or indium phosphide. In some embodiments, the substrate 202 may include alloy semiconductor such as silicon germanium, silicon germanium carbide, gallium arsenic phosphide, or gallium indium phosphide. In some embodiments, the substrate 202 may include an epitaxial layer, for example an epitaxial layer overlying a bulk semiconductor. Various microelectronic components may be formed in or on the substrate 202, such as transistor components including source/drain features, gate structures, gate spacers, source/drain contacts, gate contacts, isolation structures including shallow trench isolation (STI), or any other suitable components.

The workpiece 200 also includes an interconnect layer 210. The interconnect layer 210 may be one of the interconnect layers in a multi-layered interconnect (MLI) structure, which is formed over the substrate 202 and may include multiple patterned dielectric layers and conductive layers that provide interconnections (e.g., wiring) between the various microelectronic components of the workpiece 200. There may be intermediate layers or components between the interconnect layer 210 and the substrate 202, but in the interest of simplicity such layers or components are not shown. In an embodiment, the interconnect layer 210 is about 169 to about 230 nanometers (nm) thick.

The interconnect layer 210 may include multiple conductive components as well as an interlayer dielectric (ILD) component that partially or fully surrounds the conductive components. The conductive components may include contacts, vias, or metal lines. The ILD component may be a silicon oxide or silicon oxide containing material where silicon exists in various suitable forms. As an example, the ILD component includes silicon oxide or a low-k dielectric material whose k-value (dielectric constant) is smaller than that of silicon oxide, which is about 4. In some embodiments, the low-k dielectric material includes a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof.

In an embodiment, a carbide layer 220 is deposited on the interconnect layer 210. The deposition process includes chemical vapor deposition (CVD), physical vapor deposition (PVD), atomic layer deposition (ALD), or combinations thereof. In some embodiments, the carbide layer 220 has a generally uniform thickness of between about 45 nm and about 70 nm. Any suitable type of carbide material such as silicon carbide (SiC) can be used in the carbide layer 220.

In an embodiment, an oxide layer 230 is deposited on the carbide layer 220. Any suitable deposition process may be used, including CVD, PVD, ALD, or combinations thereof. In some embodiments, the oxide layer 230 includes undoped silicon oxide. In an embodiment, the interconnect layer 210, the carbide layer 220 and the oxide layer 230 may be replaced with one or more interconnect structures.

In an embodiment, an etch stop layer (ESL) 240 is deposited on the oxide layer 230. In some embodiments, the ESL 240 is about 45 to about 55 nm thick. The ESL 240 may include silicon carbonitride (SiCN), silicon oxycarbide (SiOC), silicon carbide (SiC), silicon oxycarbonitride (SiOCN), or silicon nitride (SiN), or combinations thereof.

A first dielectric layer 250 may be deposited on the etch stop layer 240. In some embodiments, the first dielectric layer 250 includes undoped silica glass (USG) or silicon oxide. In some embodiments, the first dielectric layer 250 is about 800 to about 1000 nm thick.

Figure 3:
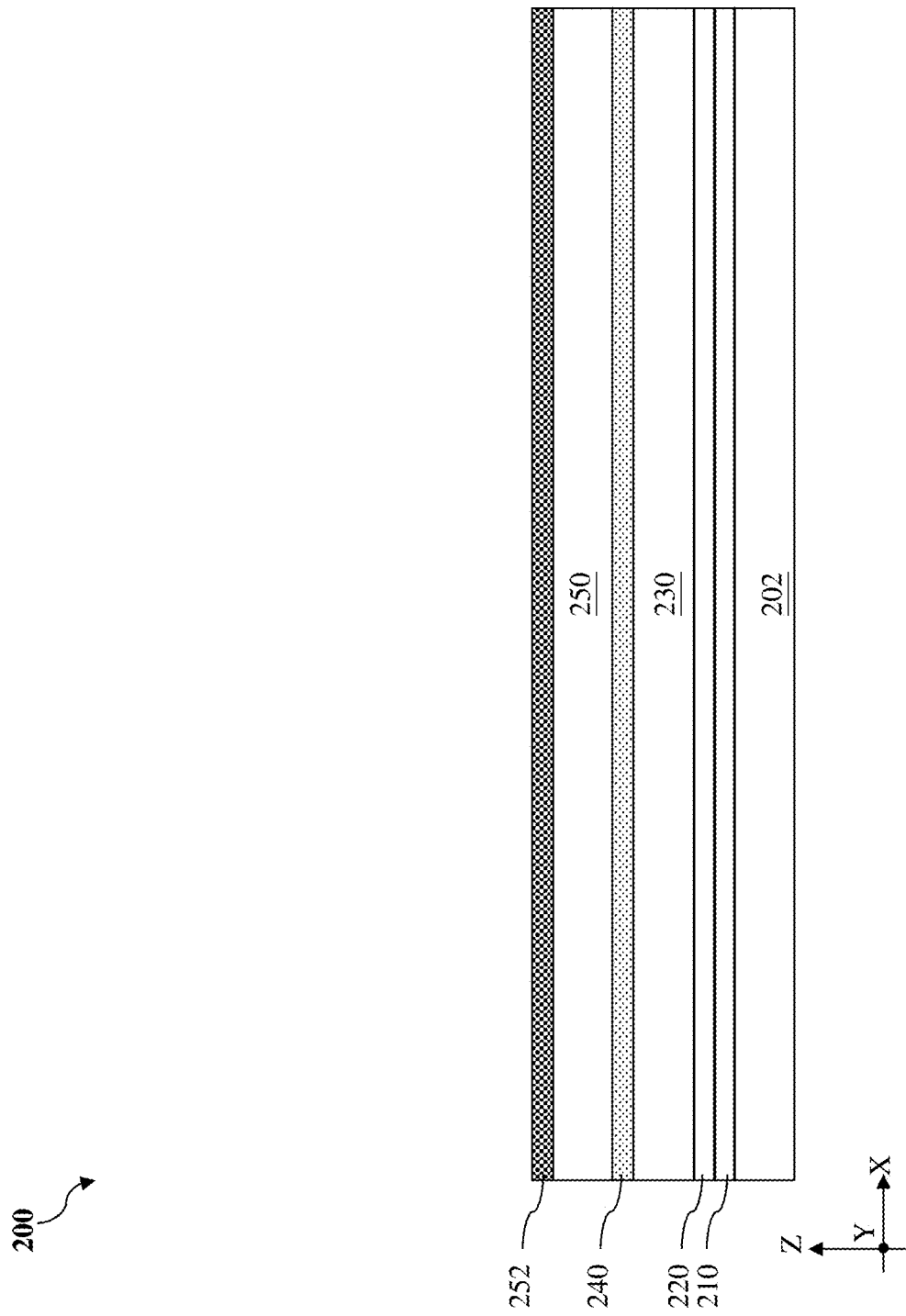
Figure 4:
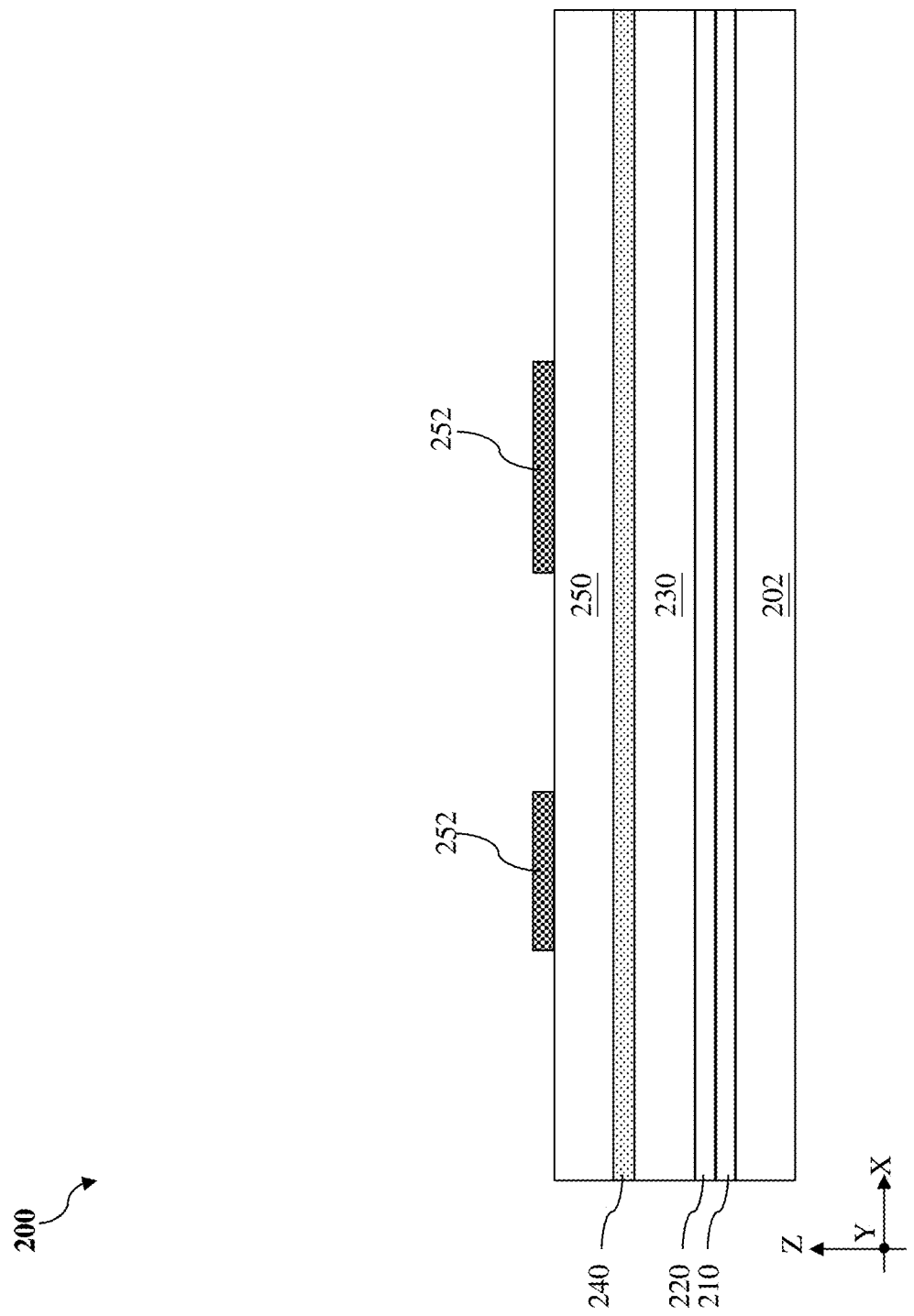
Figure 5:
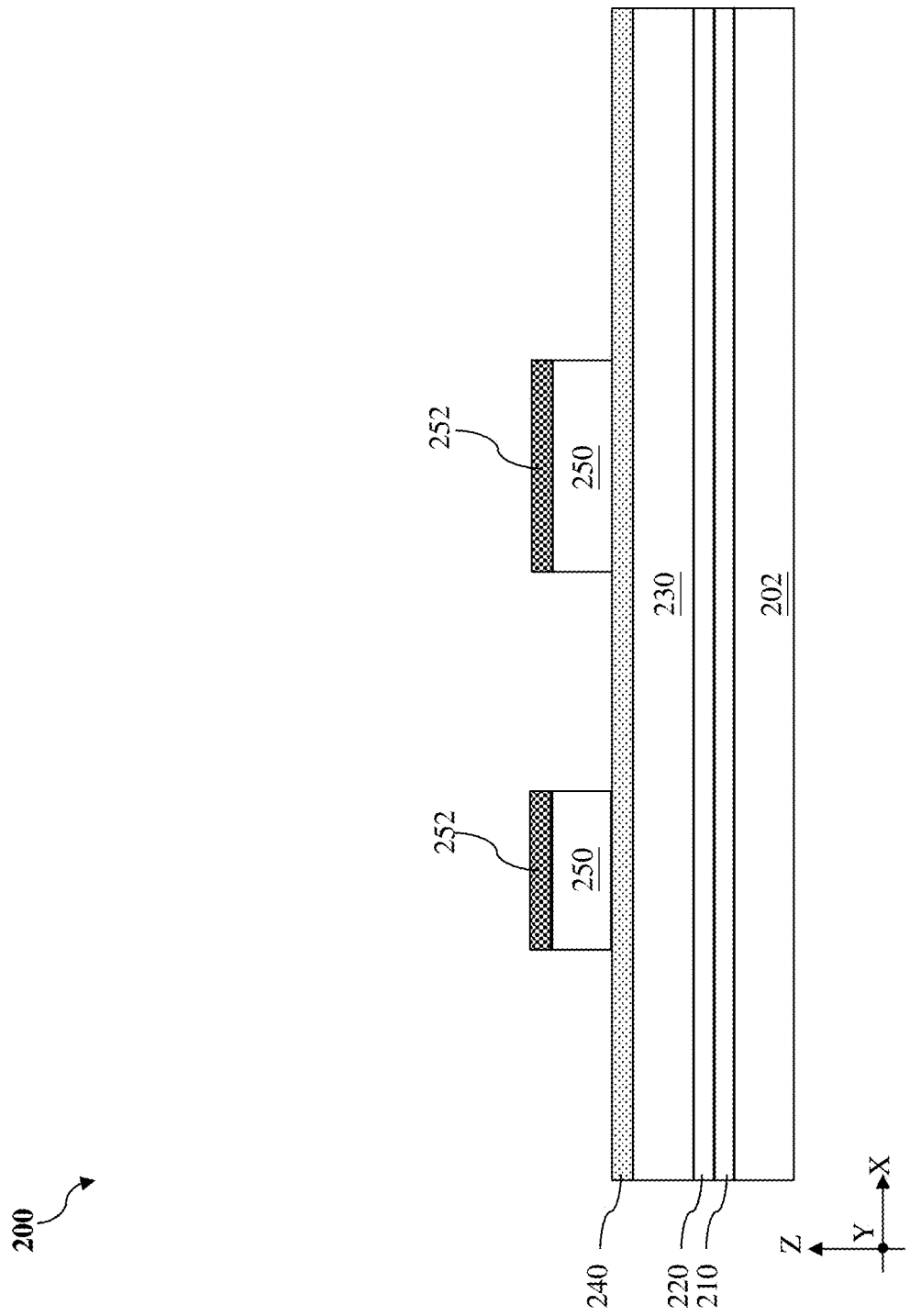
Figure 6:
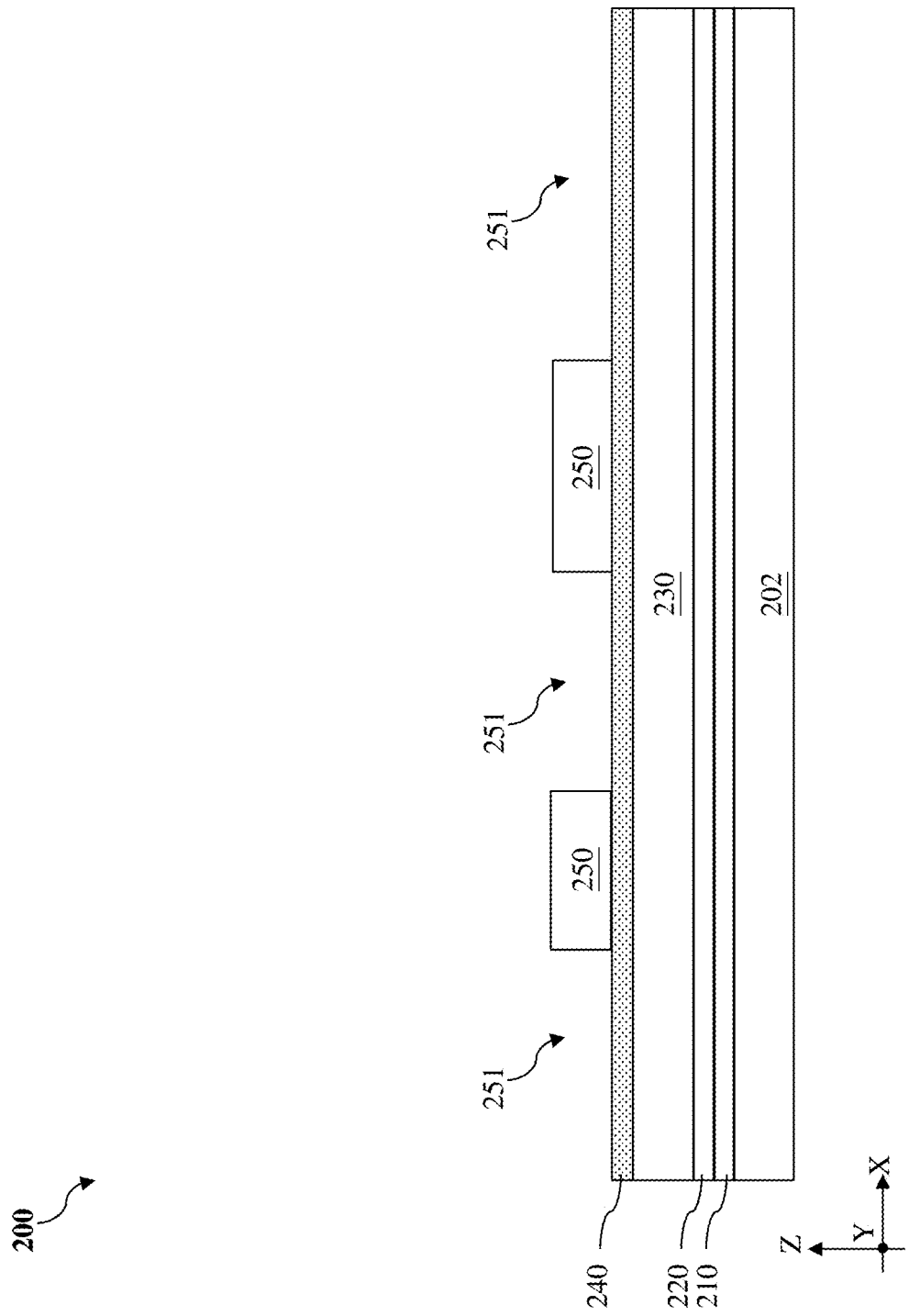

Referring to FIGS. 1 and 3-6, method 10 includes a block 14 where the first dielectric layer 250 is patterned to form trenches 251. In some implementations, patterning the first dielectric layer 250 involves multiple processes. As shown in FIG. 3, a silicon oxynitride (SiON) layer 252 is deposited on the first dielectric layer 250. In some embodiments, the SiON layer 252 is about 54 to about 66 nm thick. As shown in FIG. 4, the SiON layer 252 is patterned, for example, using a photolithography process. As shown in FIG. 5, the first dielectric layer 250 is etched to form trenches 251 therein using the SiON layer 252 as an etch mask. As shown in FIG. 6, the SiON layer 252 is removed after being used as an etch mask, leaving behind a patterned first dielectric layer 250.

Figure 7:
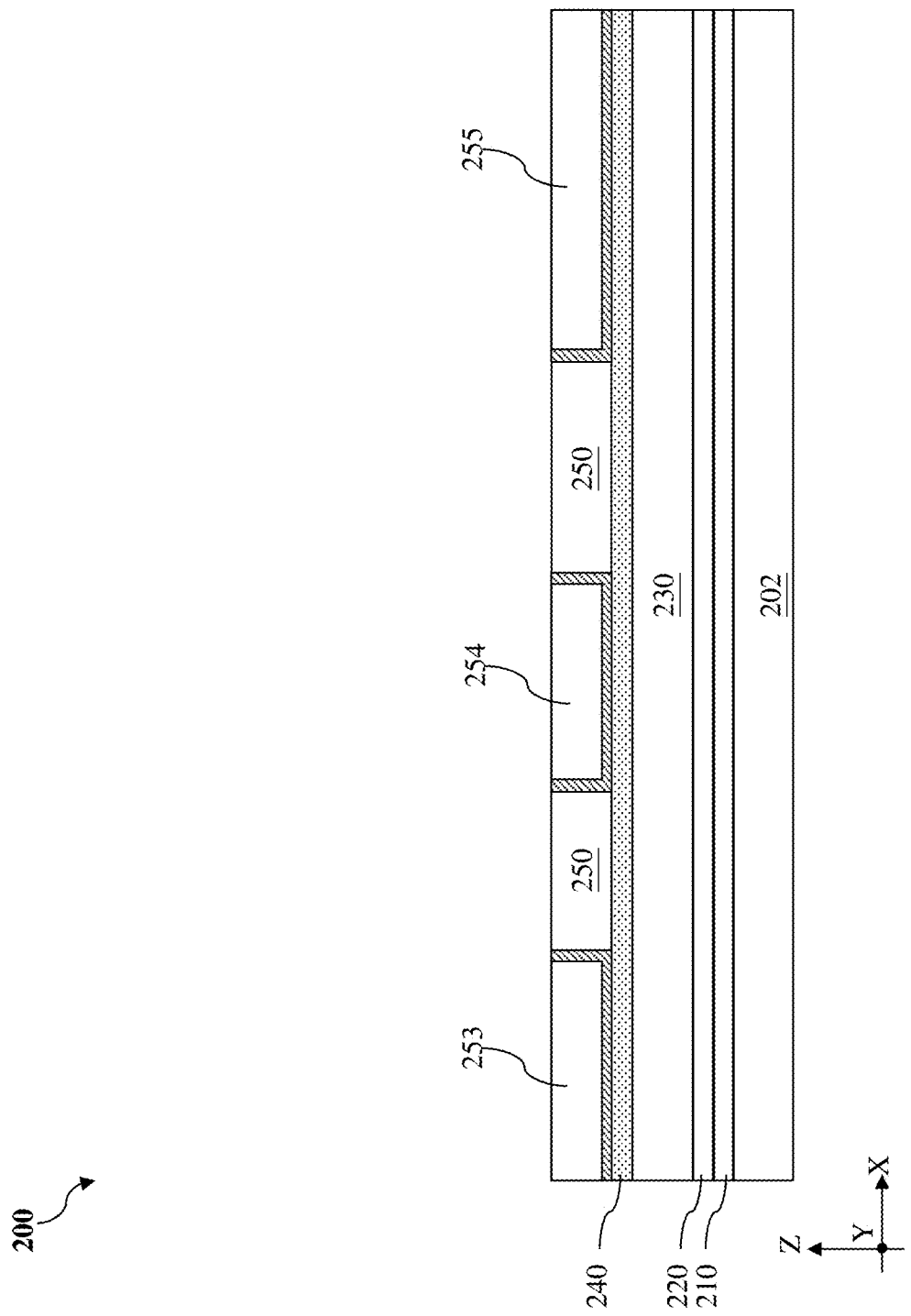

Referring to FIGS. 1 and 7, method 10 includes a block 16 where one or more lower contact features (such as 253, 254, and 255) are formed in the trenches 251 of the first dielectric layer 250. Although the lower contact features 253, 254, and 255 are disposed below upper contact features (to be discussed below), the lower contact features 253, 254, and 255 are sometimes referred to as top metal (TM) contacts because they may reside above transistor features (not shown in figures herein). Each of the lower contact features 253, 254, and 255 may include a barrier layer and a metal fill layer. Forming the lower contact features 253, 254, and 255 involves multiple processes. In some embodiments, a barrier layer 2050 is formed in each of the trenches 251, followed by the deposition of a metal fill layer over the barrier layer in the trenches. In some embodiments, the barrier layer 2050 includes titanium nitride, tantalum, tantalum nitride, or combinations thereof. In some embodiments, the metal fill layer includes a metal or metal alloy such as copper, cobalt, nickel, aluminum, tungsten, titanium, or combinations thereof. In some embodiments, the metal fill layer is formed by deposition or plating, followed by a chemical mechanical planarization (CMP) process. In an embodiment, about 5% to about 10% of the thickness of the oxide layer 150 is also removed by the CMP process.

Figure 8:
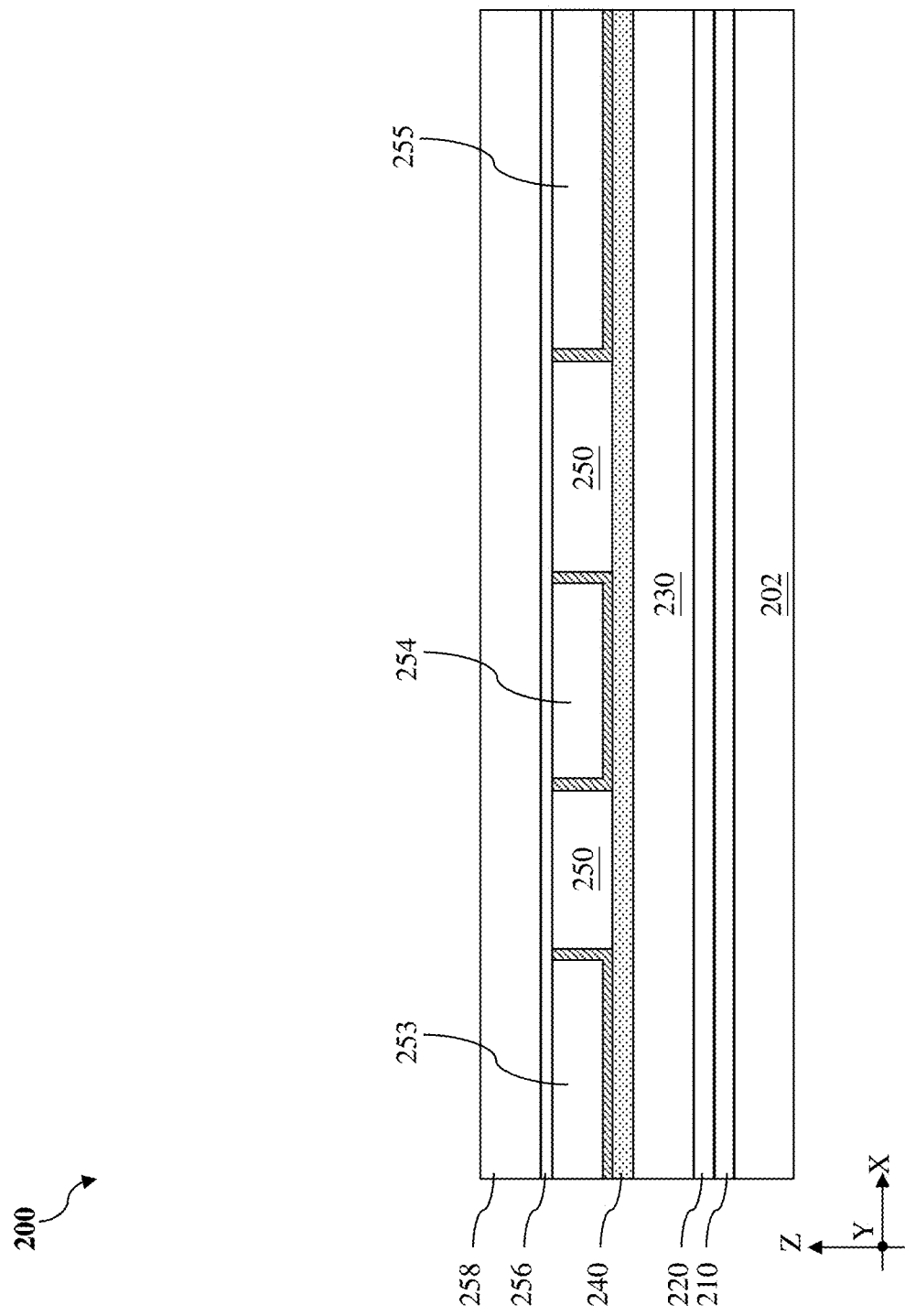

Referring to FIGS. 1 and 8, method 10 includes a block 18 where a second dielectric layer 256 is deposited over the lower contact features 253, 254, and 255. In some embodiments, the second dielectric layer 256 is about 65 to about 85 nm thick. The second dielectric layer 256 may include silicon carbonitride (SiCN), silicon nitride (SiN), and/or or other suitable materials that may protect the lower contact features 253, 254, and 255 from being oxidized. Also, at block 18, a third dielectric layer 258 is deposited over the second dielectric layer 256. In some embodiments, the third dielectric layer 258 is about 300 to about 500 nm thick. The third dielectric layer 258 may include an oxide material, such as undoped silica glass (USG), or other suitable material(s).

Figure 9:
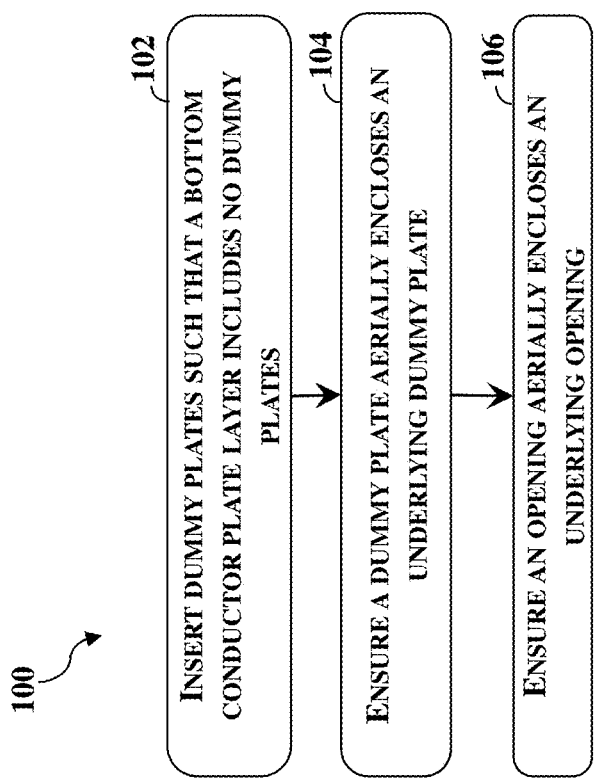
FIG. 9 is a flow chart of a method for forming an MIM structure in accordance with embodiments of the present disclosure.

Referring to FIGS. 1 and 10-14, method 10 includes a block 20 where a metal-insulator-metal (MIM) structure 260 (shown in FIG. 14) is formed over the third dielectric layer 258. As shown in FIGS. 10-14, forming the MIM structure 260 involves multiple processes, including those for formation and patterning of a bottom conductor plate layer 262, a middle conductor plate layer 266, and a top conductor plate layer 269. According to the present disclosure, the steps illustrated in method 100 in FIG. 9 are to be followed to form and pattern the conductor plate layers. Viewed differently, the steps in method 100 may be regarded as design rules to be followed when forming and patterning the conductor plate layers in the MIM structure 260. In that sense, the steps in method 100 may be shuffled or switched around. In addition, the steps or design rules may be loaded in a computer system that is used to generate a layout of the semiconductor device 200.

Figure 10:
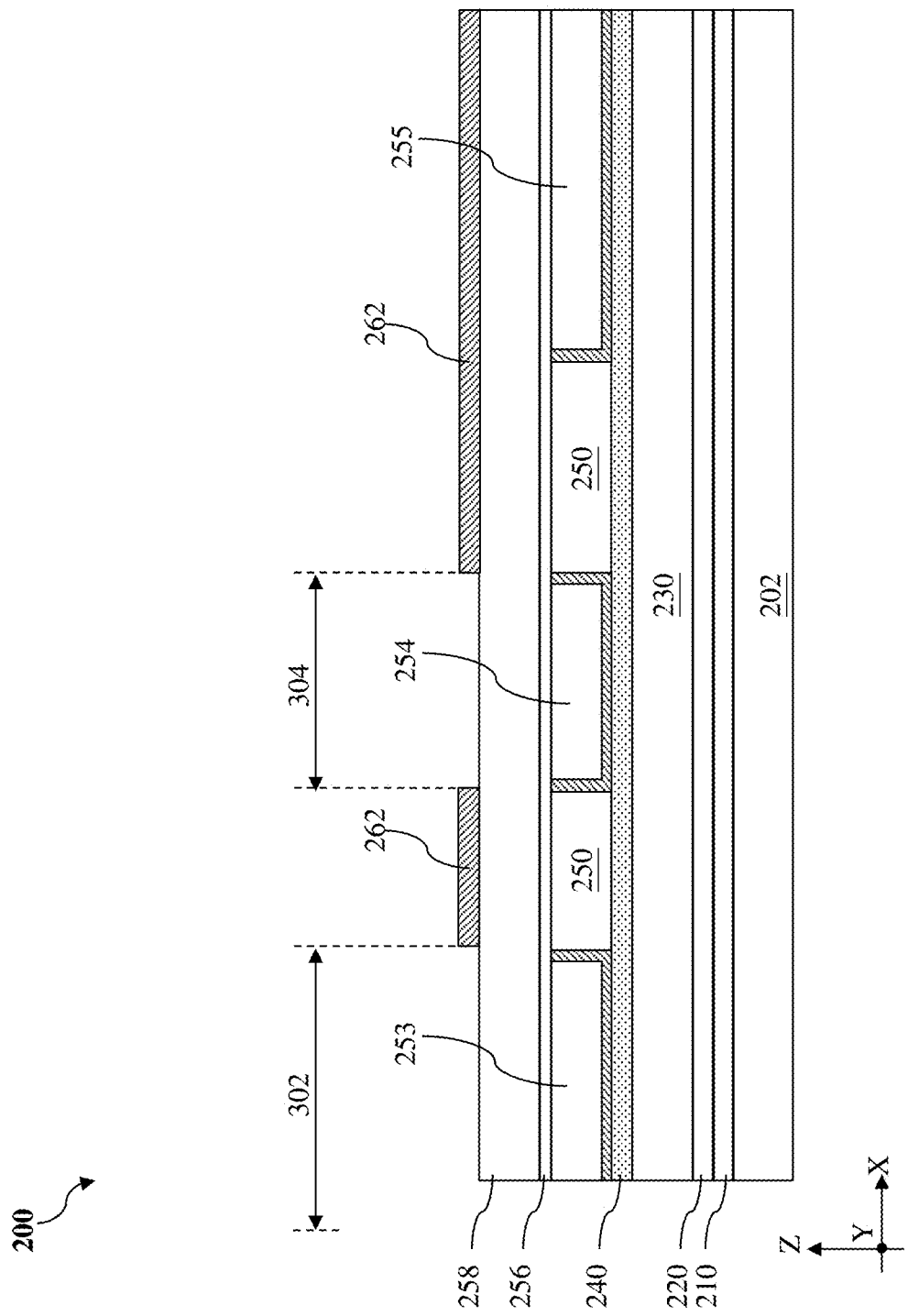
Figure 11:
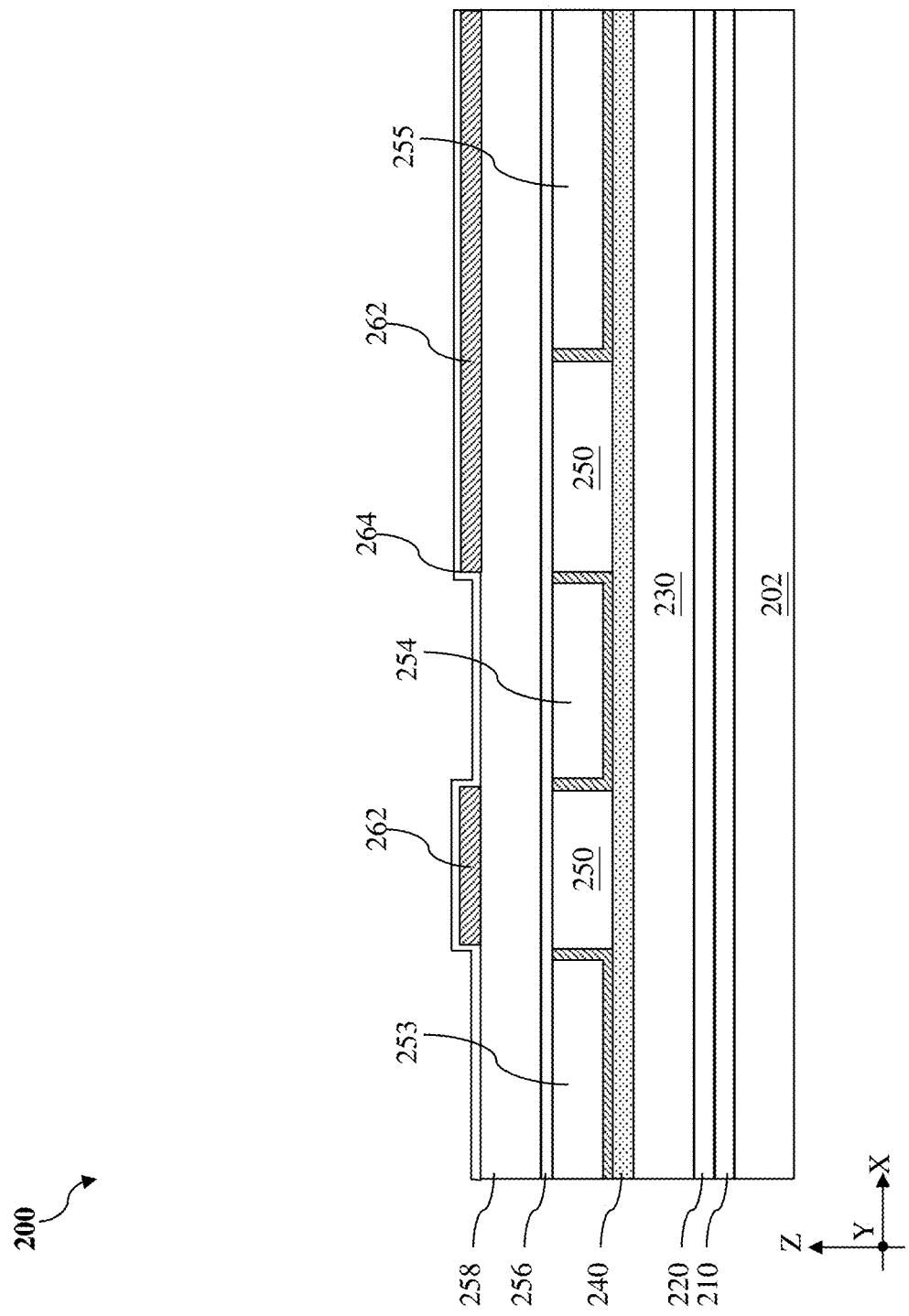
Figure 12:
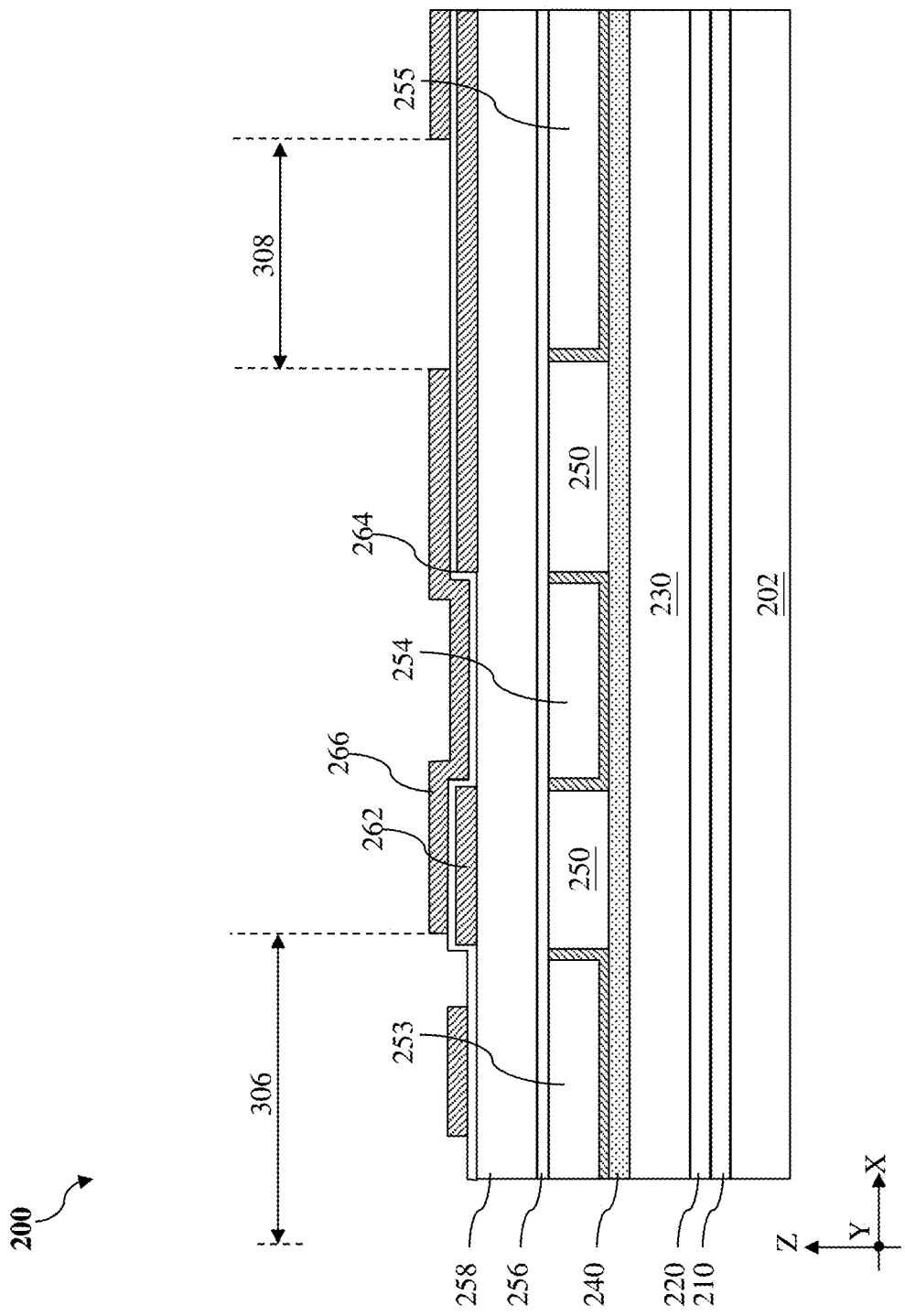
Figure 13:
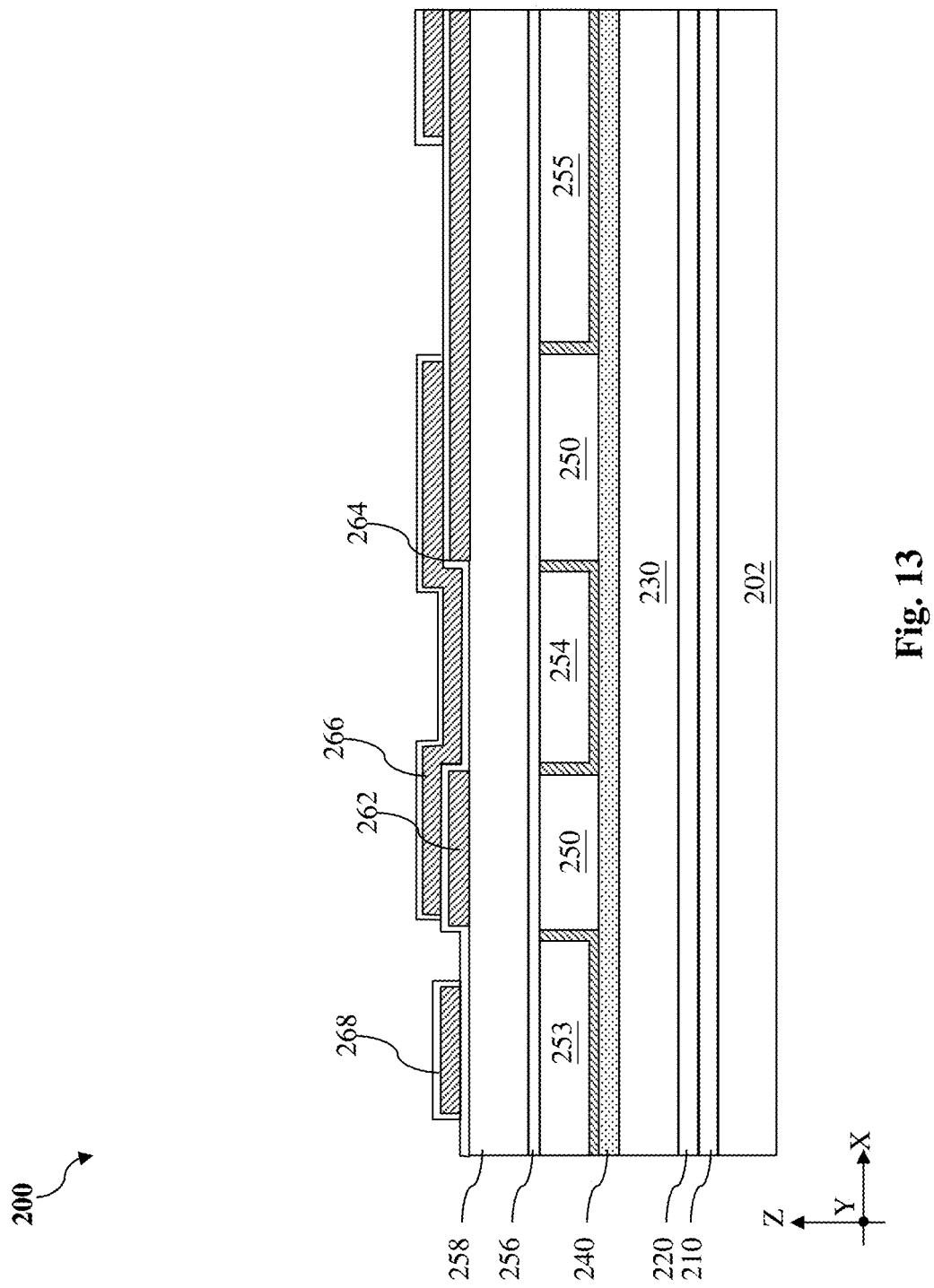
Figure 14:
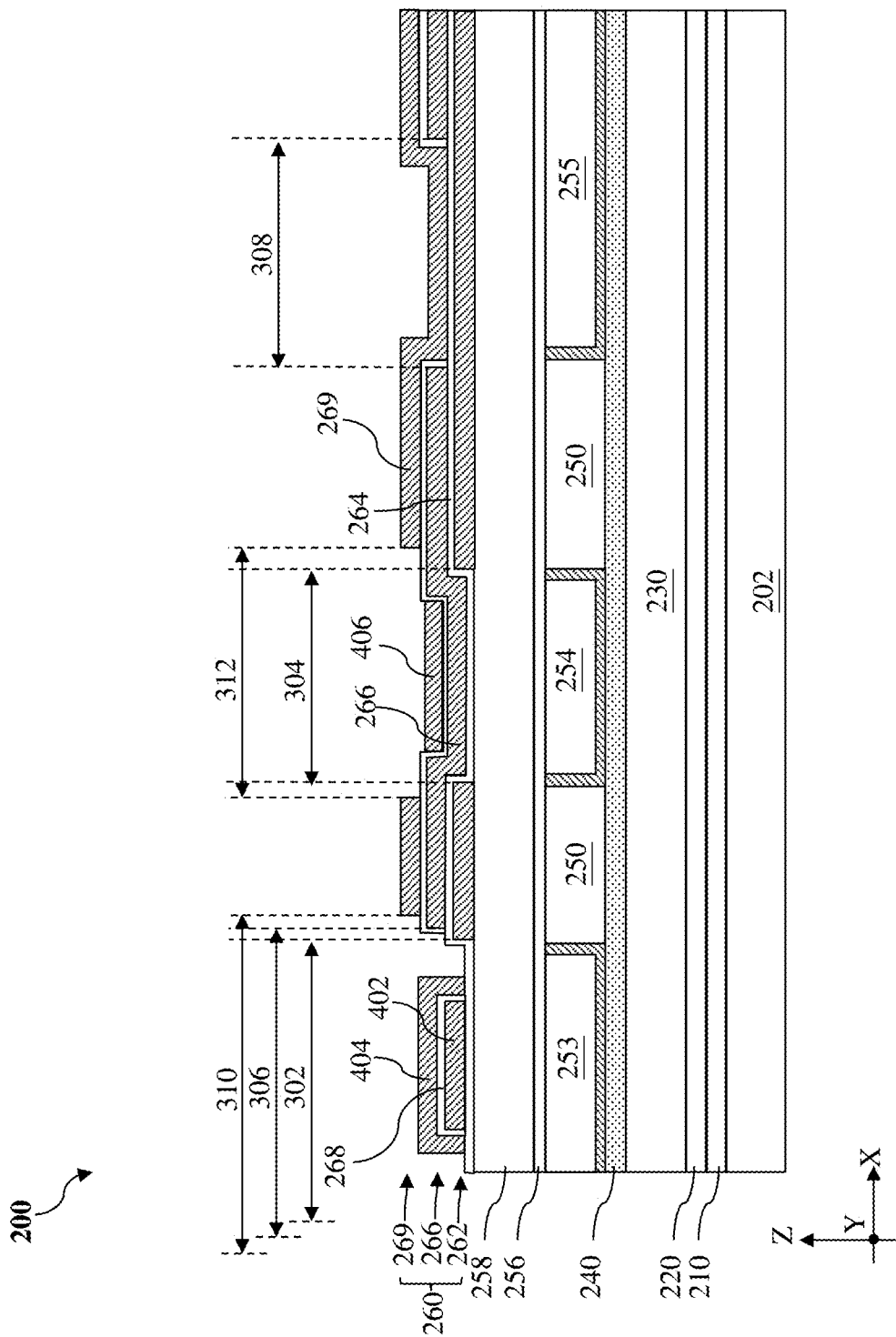

As shown in FIG. 10, a patterned bottom conductor plate layer 262 is formed on the third dielectric layer 258. Forming the bottom conductor plate layer 262 itself may involve multiple processes such as deposition, photolithography, development, and/or etching, etc. The bottom conductor plate layer 262 may go through surface treatment such as sidewall passivation using a nitrous oxide ($N_2O$) gas. In some embodiments, the bottom conductor plate layer 262 is about 35 to about 45 nm thick. As shown in FIG. 11, a first insulator layer 264 is formed on the bottom conductor plate layer 262. In an embodiment, the first insulator layer 264 is deposited to have a generally uniform thickness over the top surface of the workpiece 200 (e.g., having about the same thickness on top and sidewall surfaces of the bottom conductor plate layer 262). As shown in FIG. 12, a patterned middle conductor plate layer 266 is formed on the first insulator layer 264. The middle conductor plate layer 266 may be formed in a way similar to that used to form the bottom conductor plate layer 262, but the pattern of the middle conductor plate layer 266 may be different from that of the bottom conductor plate layer 262. As shown in FIG. 13, a second insulator layer 268 is formed on the middle conductor plate layer 266. In an embodiment, the second insulator layer 268 is deposited to have a generally uniform thickness over the top surface of the workpiece 200 (e.g., having about the same thickness on top and sidewall surfaces of the middle conductor plate layer 266). As shown in FIG. 14, a patterned top conductor plate layer 269 is formed on the second insulator layer 268. The top conductor plate layer 269 may be formed in a way similar to that used to form the middle conductor plate layer 266 or the bottom conductor plate layer 262, but the pattern of the top conductor plate layer 269 may be different from that of the middle conductor plate layer 266 or the bottom conductor plate layer 262.

Various dummy plates and openings are patterned and formed in the conductor plate layers according to method 100 in FIG. 9. The blocks in method 100 are described in conjunction with FIG. 14. Method 100 in FIG. 9 includes a block 102 where dummy plates are inserted such that the bottom conductor plate layer includes no dummy plates. As shown in FIG. 14, the bottom conductor plate layer 262 includes no dummy plates, but a first opening 302 and a second opening 304. The middle conductor plate layer 266 includes a third opening 306, a first dummy plate 402, and a fourth opening 308. The top conductor plate layer 269 includes a fifth opening 310, a second dummy plate 404, a sixth opening 312, and a third dummy plate 406. Accordingly, dummy plates are inserted either in the middle conductor plate layer 266 or the top conductor plate layer 269, but none of the dummy plates are inserted in the bottom conductor plate layer 262. The first dummy plate 402, the second dummy plate 404, and the third dummy plate 406 are electrically floating and are electrically insulated from the conductor plate layers. For example, the first dummy plate 402 is electrically insulated from the rest of the middle conductor plate layer 266. The second dummy plate 404 is electrically insulated from the rest of the top conductor plate layer 269. The third dummy plate 406 is electrically insulated from the rest of the top conductor plate layer 269.

Method 100 includes a block 104 where a dummy plate areally encloses an underlying dummy plate. As shown in FIG. 14, the first opening 302, the third opening 306, the first dummy plate 402, the fifth opening 310, and second dummy plate 404 are vertically aligned along the Z direction over the lower contact feature 253. A vertical projection area of the second dummy plate 404 is greater than that of the underlying first dummy plate 402. In other words, the second dummy plate 404 encloses the underlying first dummy plate 402 to achieve top-down enclosure of dummy plates.

Method 100 includes a block 106 where an opening areally encloses an underlying opening. As shown in FIG. 14, the first opening 302, the third opening 306, the first dummy plate 402, the fifth opening 310, and second dummy plate 404 are vertically aligned along the Z direction over the lower contact feature 253. A vertical projection area of the fifth opening 310 is greater than that of the underlying third opening 306. The vertical projection area of the third opening 306 is greater than that of the underlying first opening 302. Similarly, the second opening 304, the sixth opening 312, and the third dummy plate 406 are vertically aligned along the Z direction over the lower contact feature 254. A vertical projection area of the sixth opening 312 is greater than that of the second opening 304. That is, the fifth opening 310 areally encloses the underlying third opening 306, the third opening 306 areally encloses the underlying first opening 302, and the sixth opening 312 areally encloses the underlying second opening 304, so as to achieve top-down enclosure of openings.

As illustrated in FIG. 14, the MIM structure 260 includes multiple metal layers including the bottom conductor plate layer 262, the middle conductor plate layer 266, and the top conductor plate layer 269, which function as metal plates of capacitors. The MIM structure 260 also includes multiple insulator layers including the first insulator layer 264 disposed between the bottom conductor plate layer 262 and the middle conductor plate layer 266, as well as the second insulator layer 268 disposed between the middle conductor plate layer 266 and the top conductor plate layer 269. The MIM structure 260 is used to implement one or more capacitors, which may be connected to other electric components such as transistors. The multi-layer MIM structure 260 allows capacitors to be closely packed together in both vertical and lateral directions, thereby reducing the amount of lateral space needed for implementing capacitors. As a result, the MIM structure 260 may accommodate super high density capacitors.

In some embodiments, to increase capacitance values, the first insulator layer 264 and/or the second insulator layer 268 use high-k dielectric material(s) whose k-value is bigger than that of silicon oxide. The first and second insulator layers 264 and 268 may be relatively thin to increase capacitance values, but maintain minimal thicknesses to avoid potential breakdown of the capacitors in the MIM structure 260 (e.g., when two capacitor plates have high potential difference, current may leak between the plates, causing breakdown). In some embodiments, each of the first and second insulator layers 264 and 268 is about 50 to about 70 nm thick. Further, to optimize the capacitor performance, in some embodiments, the first insulator layer 164 (or the second insulator layer 168) is a tri-layer structure including, from bottom to top, a first zirconium oxide ($ZrO_2$) layer, an aluminum oxide ($Al_2O_3$) layer, and a second zirconium oxide ($ZrO_2$) layer, where each of the layers is about 15 to about 25 nm thick.

Figure 15:
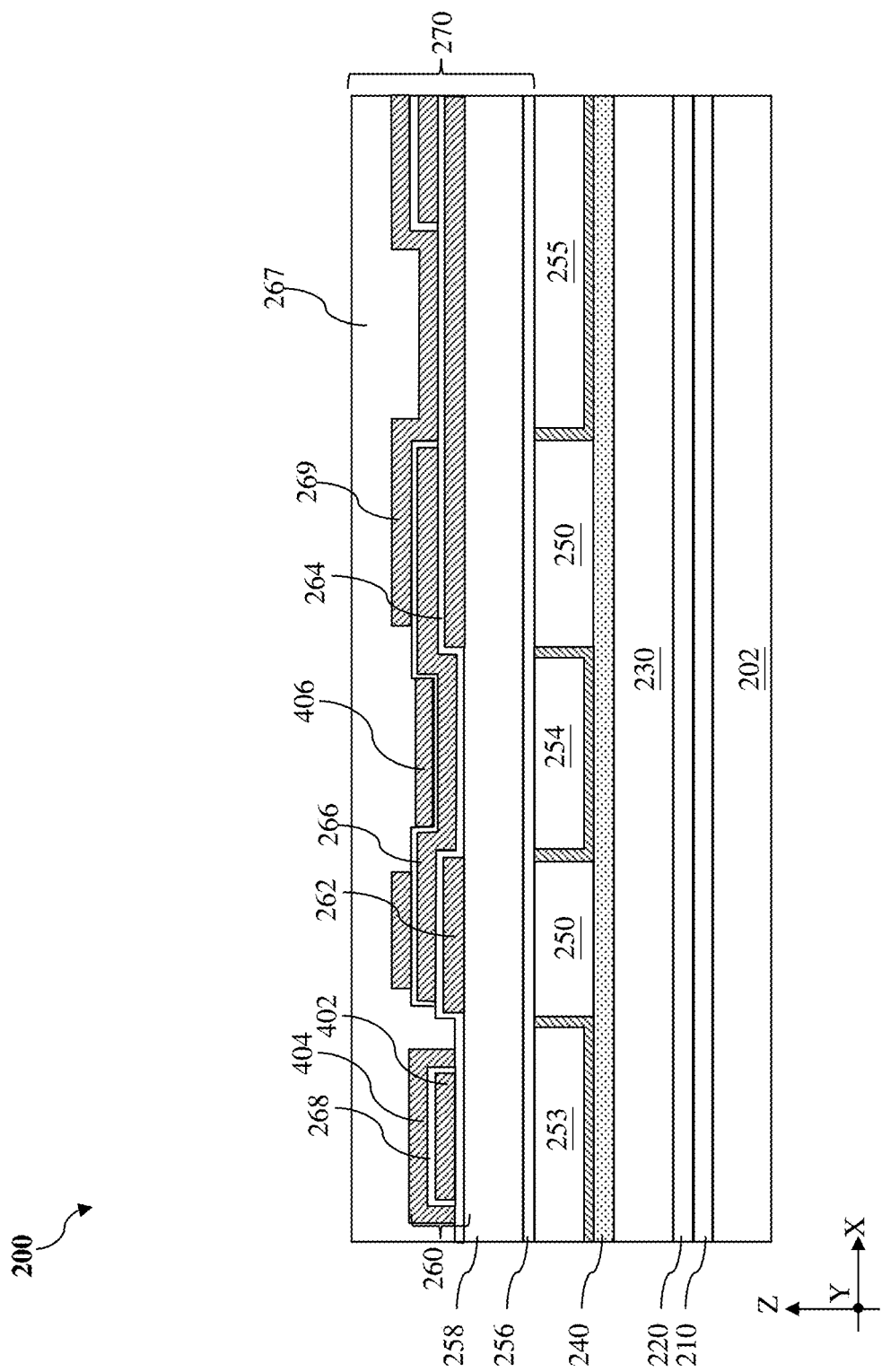

Referring to FIGS. 1 and 15, method 10 includes a block 22 where a fourth dielectric layer 267 is deposited over the MIM structure 260. In some embodiments, the fourth dielectric layer 267 is about 400 to about 500 nm thick. In some embodiments, the third dielectric layer 258 may include an oxide material, such as undoped silica glass, or other suitable material(s). In some embodiments, the fourth dielectric layer 267 is formed by depositing about 900 to about 1000 nm of the oxide material, followed by a CMP process to reach the final thickness. As shown in FIG. 15, the MIM structure 260 is sandwiched between the third dielectric layer 258 and the fourth dielectric layer 267, which may have the same material and/or the same thickness. In some embodiments, the second dielectric layer 256, the third dielectric layer 258, the MIM structure 260, and the fourth dielectric layer 267 are regarded as parts of a first multi-layer passivation structure 270. Alternatively, if the MIM structure 260 is not present in the passivation structure 270, the third dielectric layer 258 and the fourth dielectric layer 267 may be combined as a single dielectric layer (e.g., about 900 to about 1100 nm thick) over the second dielectric layer 256.

Figure 16:
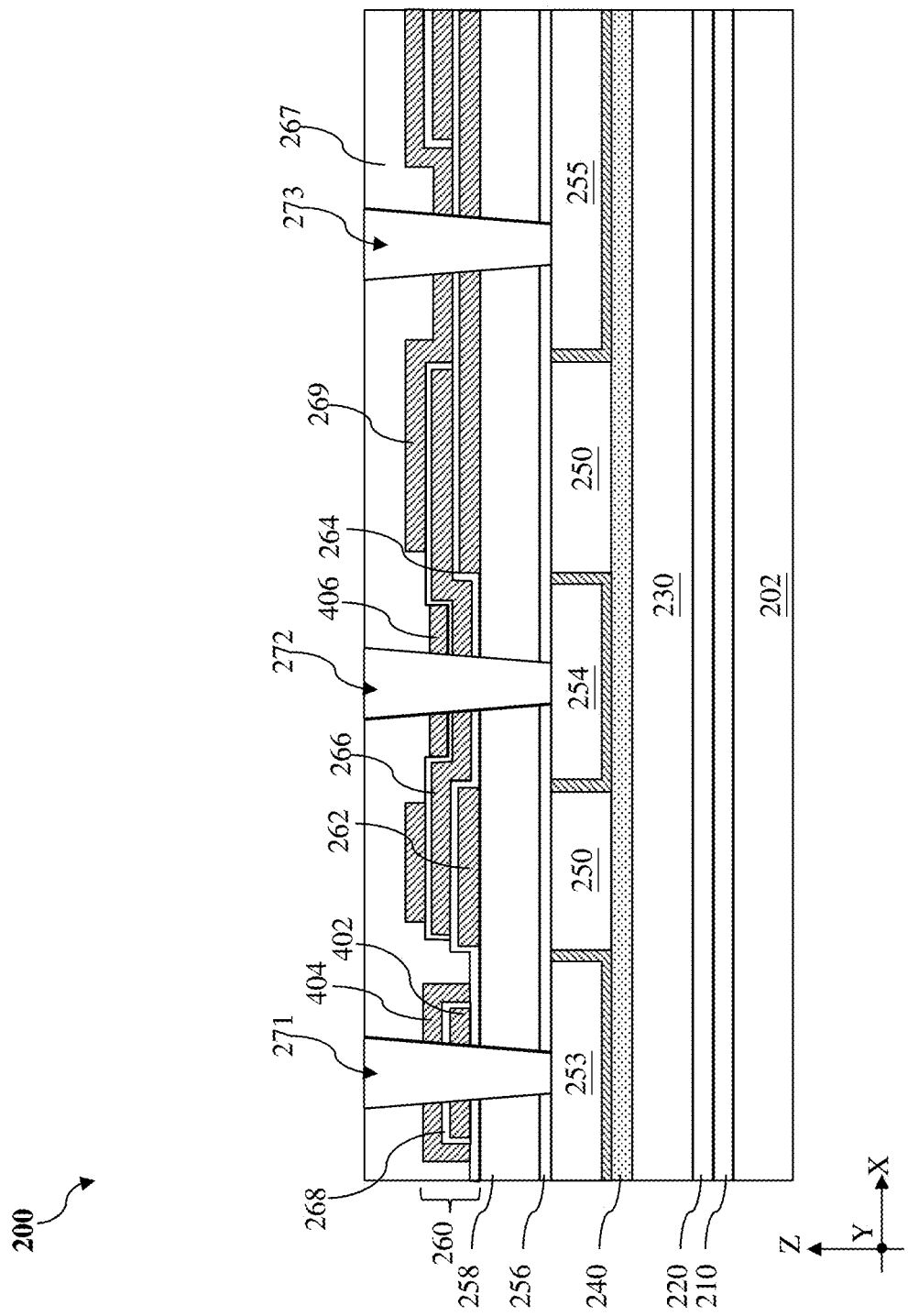

Referring to FIGS. 1 and 16, method 10 includes a block 24 where one or more openings (such as openings 271, 272, and 273) are formed to penetrate through, from top to bottom, the fourth dielectric layer 267, the MIM structure 260, the third dielectric layer 258, and the second dielectric layer 256. The openings 271, 272, and 273 expose top surfaces of the contact features 253, 254, and 255, respectively. In some embodiments, a dry etching process is performed to form the openings 271, 272, and 273. Depending on the application, the sidewall of each opening may expose different conductor plate layers of the MIM structure 260. As illustrated in FIG. 16, the opening 271 exposes sidewalls of the first dummy plate 402 in the middle conductor plate layer 266 and the second dummy plate 404 in the top conductor plate layer 269. The opening 272 exposes sidewalls of the third dummy plate 406 and the middle conductor plate layer 266. The opening 273 exposes sidewalls of the top conductor plate layer 269 and the bottom conductor plate layer 262.

Figure 17:
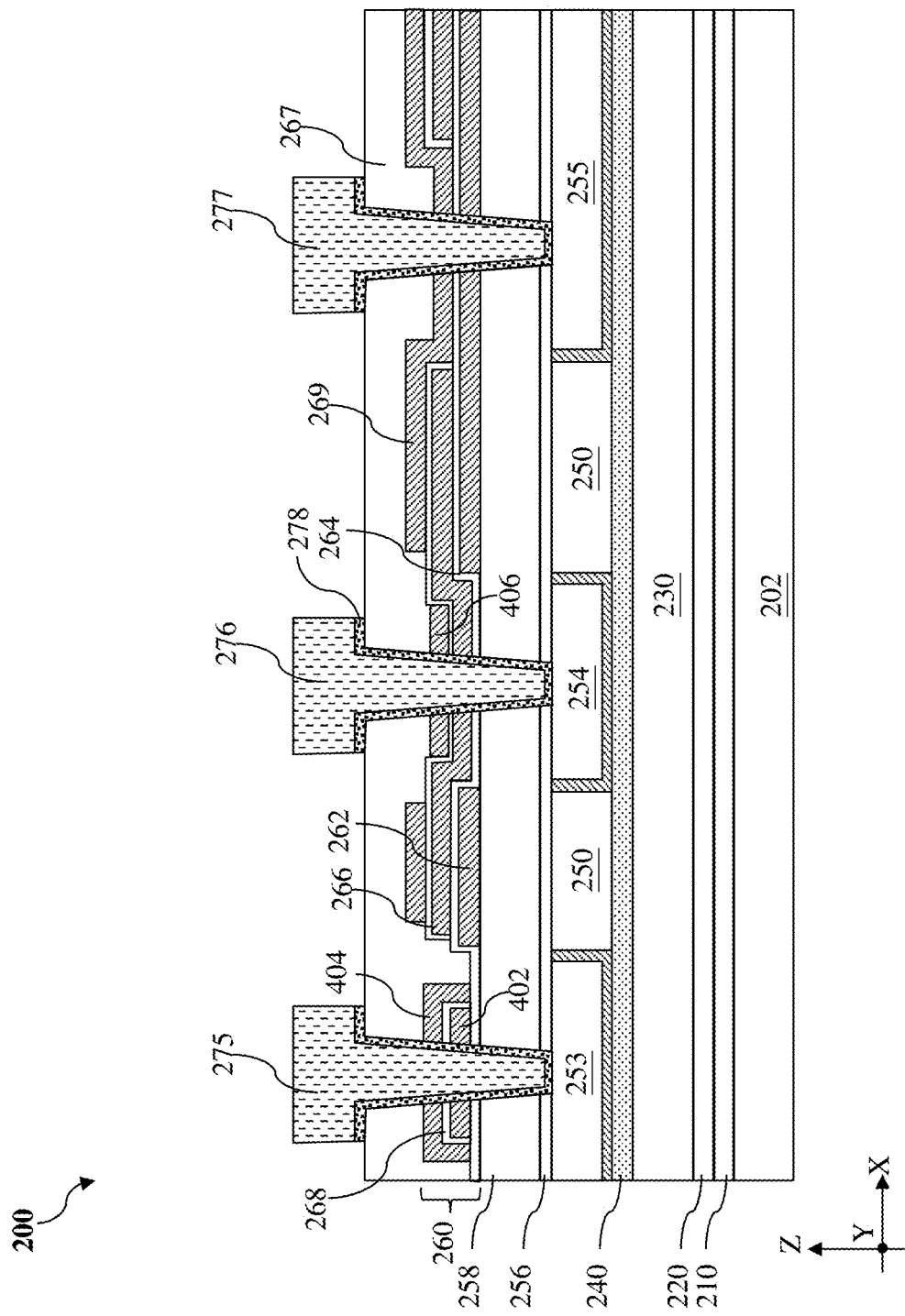

Referring to FIGS. 1 and 17, method 10 includes a block 26 where one or more upper contact features (such as 275, 276, and 277) are formed in and over the openings 271, 272, and 273, respectively. The upper contact features 275, 276, and 277 include contact vias that fill the openings 271, 272 and 273 and may be referred to as contact via, metal vias, or metal lines. In some embodiments, to form the one or more upper contact features (such as 275, 276 and 277), a barrier layer 278 is first conformally deposited over the fourth dielectric layer 267 and into the openings 271, 272 and 273 using a suitable deposition technique, such as atomic layer deposition (ALD), physical vapor deposition (PVD) or chemical vapor deposition (CVD) and then a metal fill layer is deposited over the barrier layer 278 using a suitable deposition technique, such as ALD, PVD or ALD. The deposited barrier layer 278 and the metal fill layer are then patterned to form upper contact features 275, 276 and 277, as illustrated in the example in FIG. 17. In some embodiments, the barrier layer 278 and the metal fill layer are patterned in a two-stage or multiple-stage etch process. In embodiments represented in FIG. 17, portions of the upper contact features 275, 276 and 277 above the fourth dielectric layer 267 have substantially straight sidewalls. In other embodiments not explicitly shown in FIG. 17, portions of the upper contact features 275, 276 and 277 above the fourth dielectric layer 267 have tapered sidewalls. In some implementations, the anisotropic etch process step etches faster than the isotropic etch process step and requires more energy.

At least the upper portion of the upper contact features 275, 276, and 277 are part of a redistribution layer (RDL) to reroute bond connections between upper and lower layers. The upper contact features 275, 276, and 277 each penetrate through, from top to bottom, the fourth dielectric layer 267, the MIM structure 260, the third dielectric layer 258, and the second dielectric layer 256. The upper contact features 275, 276, and 277 make electrical contact with the lower contact features 253, 254, and 255, respectively. The upper contact feature 275 is a logic contact via that is electrically coupled to the lower contact feature 253 but electrically insulated from the functional portion of the MIM structure 260. While the upper contact feature 275 is electrically coupled to the first dummy plate 402 and the second dummy plate 404, the first dummy plate 402 and the second dummy plate 404 are electrically floating. As such the upper contact feature 275 is electrically insulated from any of the bottom conductor plate layer 262, the middle conductor plate layer 266, and the top conductor plate layer 269. The upper contact feature 277 is an MP contact via that is electrically coupled to the middle conductor plate layer 266 but is electrically insulated from the bottom conductor plate layer 262 and the top conductor plate layer 269. While the upper contact feature 277 is electrically coupled to the third dummy plate 406, the third dummy plate 406 is electrically floating and is electrically insulated from the rest of the top conductor plate layer 269. The upper contact feature 279 is a TPBP contact via that is electrically coupled to the bottom conductor plate layer 262 and the top conductor plate layer 269 but is electrically insulated from the middle conductor plate layer 266. Because the upper contact feature 279 extends through the fourth opening 308, the upper contact feature 279 is electrically insulated from the middle conductor plate layer 266.

Figure 18:
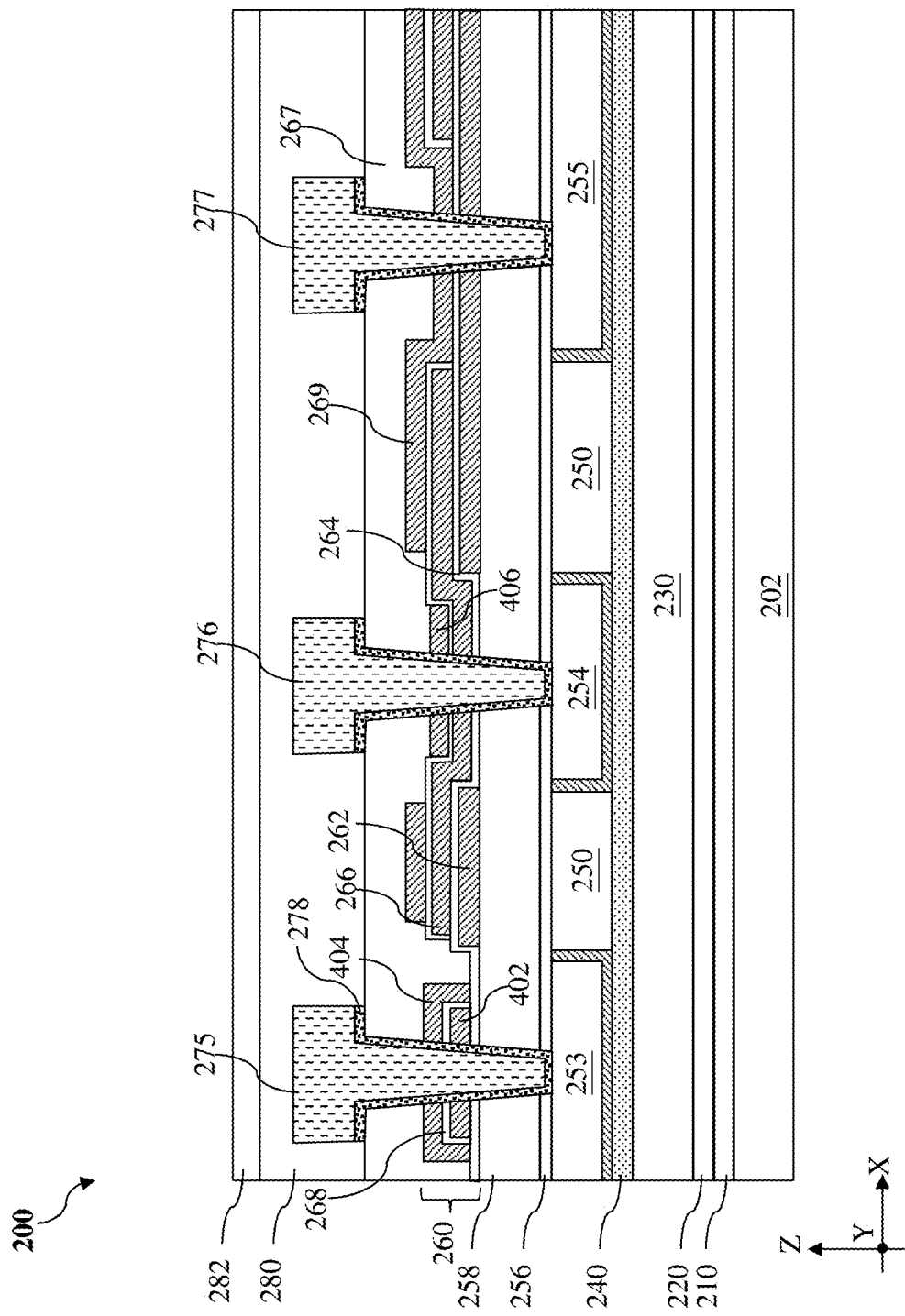

Referring to FIGS. 1 and 18, method 100 includes a block 28 where a passivation structure 180 is formed over upper contact features 275, 276, and 277 and over the fourth dielectric layer 267. As shown in FIG. 18, a first passivation layer 280 is formed over the workpiece 200, including over the upper contact features 275, 276, and 277 and the fourth dielectric layer 267. In some embodiments, the first passivation layer 280 may include one or more plasma-enhanced oxide layers, one or more undoped silica glass layers, or a combination thereof. The first passivation layer 280 may be formed using CVD, spin-on coating, or other suitable technique. In some implementations, the first passivation layer 280 may be formed to a thickness between about 1000 nm and about 1400 nm, including 1200 nm. A second passivation layer 282 is formed over the first passivation layer 280. In some embodiments, the second passivation layer 282 may include silicon nitride (SiN) and may be formed by CVD, PVD or a suitable method to a thickness between about 600 nm and about 800 nm, including 700 nm.

Figure 19:
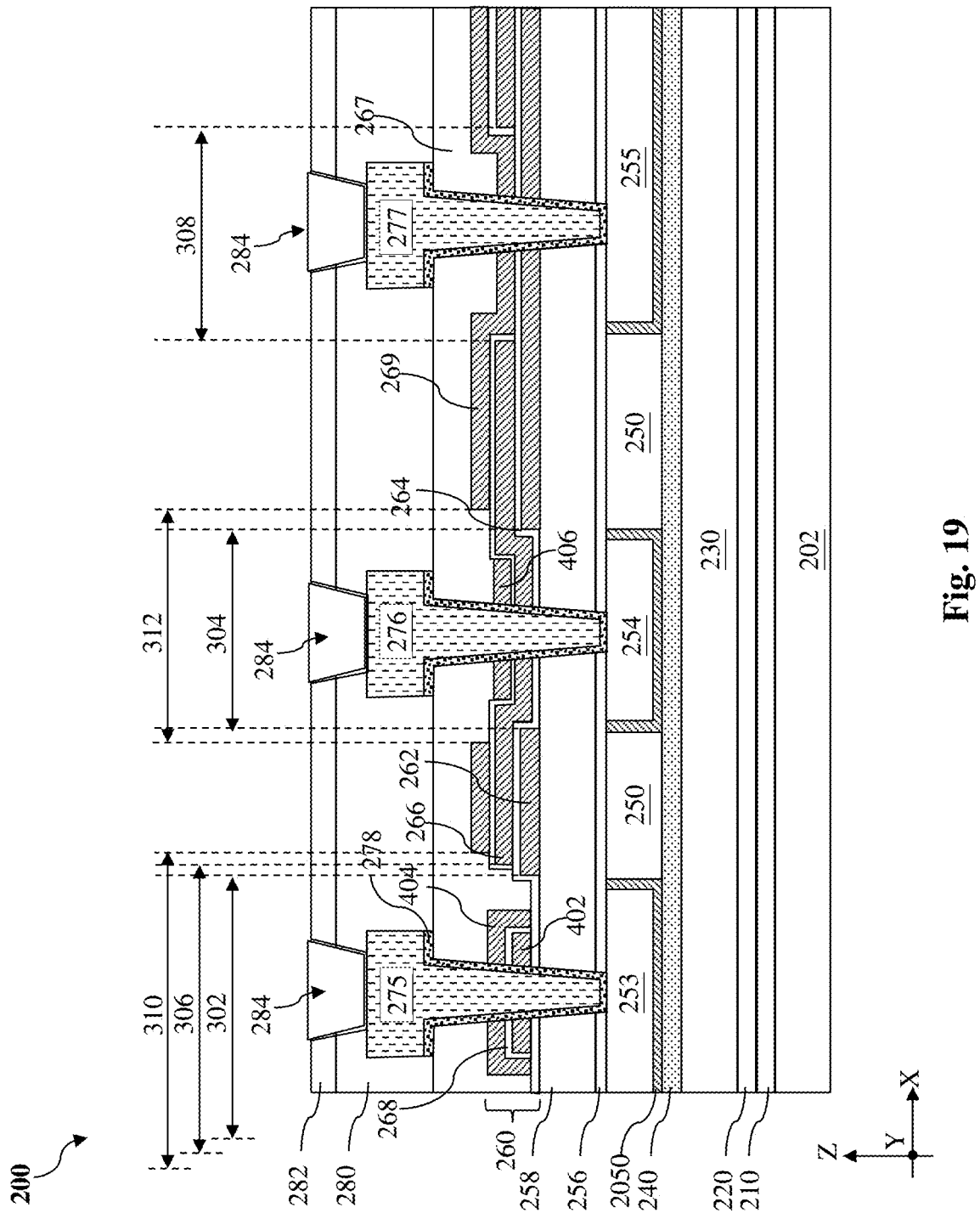

Referring to FIGS. 1 and 19, method 10 includes a block 30 where further processes may be performed. Such further processes may include formation of the openings 284 through the first passivation layer 280 and the second passivation layer 282, deposition of one or more polymeric material layers, patterning of the one or more polymeric material layers, deposition of an under-bump-metallurgy (or under-bump-metallization, UBM) layer, deposition of a copper-containing bump layer, deposition of a cap layer, deposition of a solder layer, and reflowing of the solder layer. These further processes form contact structures for connection to external circuitry.

Figure 20:
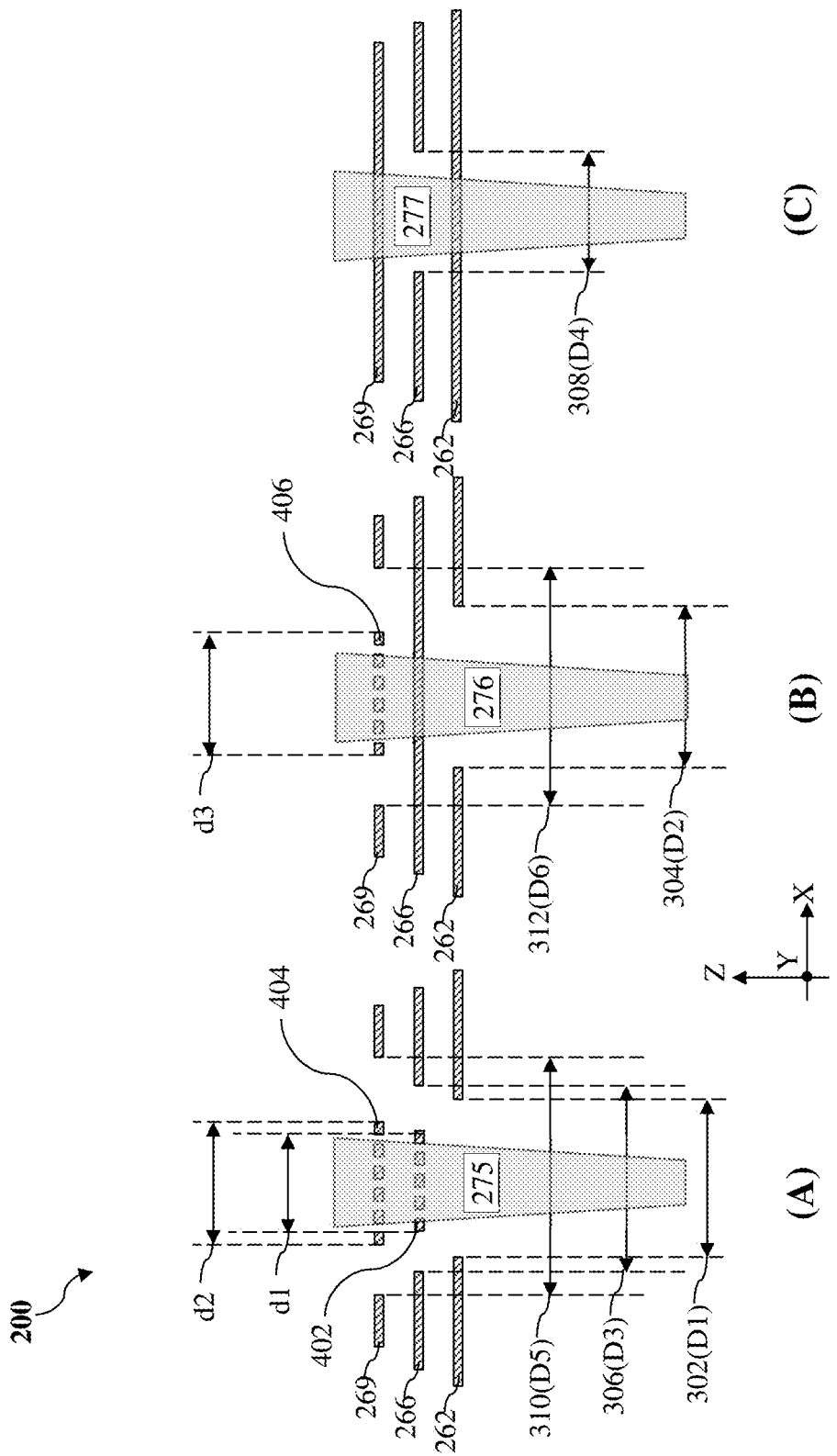
FIG. 20 is a diagrammatic and fragmentary cross-sectional view of conductor plate layers in an MIM structure in accordance with embodiments of the present disclosure.
Figure 21:
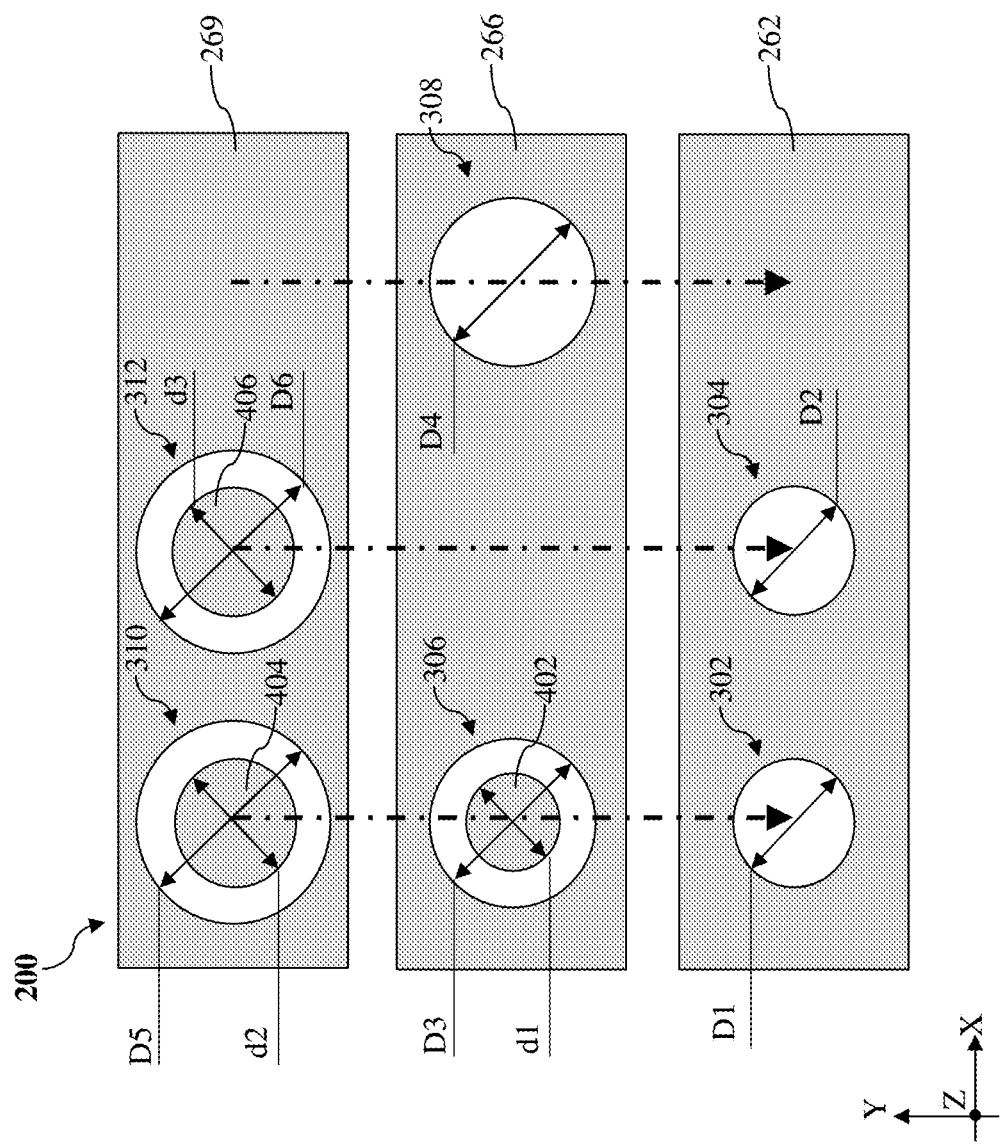
FIG. 21 a diagrammatic and fragmentary top view of conductor plate layers in an MIM structure in accordance with embodiments of the present disclosure.

Methods according to the present disclosure, such as method 100, produce unique structures that are further illustrated in FIGS. 20 (including 20(A), 20(B) and 20(C)) and 21. It is noted that, throughout the present disclosure, like numbers denote like structures. For examples, reference numerals in FIGS. 20 and 21 correspond to those in FIG. 19. It follows that the structures shown in FIGS. 20 and 21 correspond to that shown in FIG. 19. It is further noted that, compared to the structure in FIG. 19, structures shown in FIGS. 20 and 21 are simplified to better illustrate the concept contemplated by the present disclosure. For example, while each of the bottom conductor plate layer 262, the middle conductor plate layer 266, and the top conductor plate layer 269 are illustrated as planar on the X-Y plane in FIG. 20, each of them may include various topographical features that are disposed over an underlying layer or within a recess defined in an underlying layer. It is still further noted that, while the upper contact features 275, 276 and 277 are illustrated as being adjacent to one another for ease of comparison, each of them may be disposed at suitable location within a semiconductor device.

Reference is made to FIG. 20(A) and 21. The bottom conductor plate layer 262 includes a first opening 302. The middle conductor plate layer 266 includes a third opening 306 and a first dummy plate 402 disposed within the third opening. The top conductor plate layer 269 includes a fifth opening 310 and a second dummy plate 404 disposed within the fifth opening 310. In some embodiments represented in FIG. 20(A), the fifth opening 310, the third opening 306, the first opening 302, the first dummy plate 402, and the second dummy plate 404 are vertically aligned along the Z direction. As illustrated in FIG. 20(A), the upper contact feature 275 extends through the second dummy plate 404, the first dummy plate 402, the fifth opening 310, the third opening 306, and the first opening 302. As described above, the upper contact feature 275 is a logic contact via that is electrically insulated from the bottom conductor plate layer 262, the middle conductor plate layer 266, and the top conductor plate layer 269. While the upper contact feature 275 is in contact with and electrically coupled to the first dummy plate 402 and the second dummy plate 404, the first dummy plate 402 and the second dummy plate 404 are insulated from the middle conductor plate layer 266 and the top conductor plate layer 269, respectively. The first opening 302 has a first opening dimension D1 along the X direction, the third opening 306 has a third opening dimension D3 along the X direction, and the fifth opening 310 has a fifth opening dimension D5. In some embodiments where each of the openings are substantially circular, each of the first opening dimension D1, the third opening dimension D3, and the fifth opening dimension D5 is a diameter of the respective opening. Pursuant to the top-down enclosure configuration described above, the fifth opening dimension D5 of the fifth opening 310 is greater than the underlying third opening dimension D3 of the third opening 306; and the third opening dimension D3 of the third opening 306 is greater than the first opening dimension D1 of the first opening 302. The first dummy plate 402 has a first dummy dimension d1 along the X direction and the second dummy plate 404 has a second dummy dimension d2 along the X direction. In some embodiments where each of the dummy plates are substantially circular, each of the first dummy dimension d1 and the second dummy dimension d2 is a diameter of the respective dummy plate. Pursuant to the top-down enclosure configuration described above, the second dummy dimension d2 of the second dummy plate 404 is greater than the underlying first dummy dimension d1 of the first dummy plate 402.

Reference is made to FIGS. 20(B) and 21. The bottom conductor plate layer 262 includes a second opening 304. The top conductor plate layer 269 includes a sixth opening 312 and a third dummy plate 406 disposed within the sixth opening 312. In some embodiments represented in FIG. 20(B), the sixth opening 312, the second opening 304, and the third dummy plate 406 are vertically aligned along the Z direction. As illustrated in FIG. 20(B), the upper contact feature 276 extends through the third dummy plate 406, the sixth opening 312, and the second opening 304. As described above, the upper contact feature 276 is a MP contact via that is electrically coupled to the middle conductor plate layer 266 but is electrically insulated from the bottom conductor plate layer 262 and the top conductor plate layer 269. While the upper contact feature 276 is in contact with and electrically coupled to the third dummy plate 406, the third dummy plate 406 is insulated from the top conductor plate layer 269. The second opening 304 has a second opening dimension D2 along the X direction and the sixth opening 312 has a sixth opening dimension D6. In some embodiments where each of the openings are substantially circular, each of the second opening dimension D2 and the sixth opening dimension D6 is a diameter of the respective opening. Pursuant to the top-down enclosure configuration described above, the sixth opening dimension D6 of the sixth opening 312 is greater than the underlying second opening dimension D2 of the second opening 304. The third dummy plate 406 has a third dummy dimension d3 along the X direction. In some embodiments where each of the dummy plates are substantially circular, the third dummy dimension d3 is a diameter of the third dummy plate 406.

Reference is made to FIGS. 20(C) and 21. The middle conductor plate layer 266 includes a fourth opening 308. As illustrated in FIG. 20(C), the upper contact feature 277 extends through the bottom conductor plate layer 262, the fourth opening 308, and the top conductor plate layer 269. As described above, the upper contact feature 277 is a TPBP contact via that is electrically coupled to the bottom conductor plate layer 262 and the top conductor plate layer 269 but is electrically insulated from the middle conductor plate layer 266. The fourth opening 308 has a fourth opening dimension D4 along the X direction. In some embodiments where the fourth opening 308 is substantially circular, the fourth opening dimension D4 is a diameter of the fourth opening 308.

Methods and semiconductor devices according to the present disclosure provide advantages. For example, because vertically aligned dummy plates and vertically aligned conductor plate openings are arranged/configured based on top-down enclosure (i.e., a vertical projection area of a dummy plate/opening is greater than that of an underlying dummy plate/opening), openings and dummy plates are size-matched such that larger openings accommodate larger dummy plates. This arrangement/configuration is compatible with design rules regarding spacings between dummy plates and openings. It has been observed that, compared to an MIM capacitor fabricated using a conventional method, an MIM capacitor in a semiconductor device fabricated using methods of the present disclosure enjoys an increase of effective area. In some instances, the increase of effective area may be between about 20% and about 30%, including about 25%. The increased effective area leads to increased capacitance, resulting in noise reduction and switching speed increase.

One aspect of the present disclosure involves semiconductor device. The semiconductor device includes a metal-insulator-metal structure. The metal-insulator-metal structure includes a bottom conductor plate layer having a first opening and a second opening; a first dielectric layer over the bottom conductor plate layer, a middle conductor plate layer over the first dielectric layer, where the middle conductor plate layer includes a third opening, a first dummy plate disposed within the third opening, and a fourth opening; a second dielectric layer over the middle conductor plate layer; and a top conductor plate layer over the second dielectric layer, where the top conductor plate layer has a fifth opening, a second dummy plate disposed within the fifth opening, a sixth opening, and a third dummy plate disposed within the sixth opening. The first opening, the first dummy plate, and the second dummy plate are vertically aligned.

In some embodiments, the second opening and the third dummy plate are vertically aligned. In some implementations, the first dummy plate, the second dummy plate, and the third dummy plate are electrically floating. In some instances, the semiconductor device may further include a first contact via electrically coupled to the first dummy plate and the third dummy plate, and electrically insulated from the bottom conductor plate layer. In some embodiments, the first contact via extends through first opening in the bottom conductor plate layer. In some implementations, the semiconductor device may further include a second contact via electrically coupled to the third dummy plate and the middle conductor plate layer, and electrically insulated from the bottom conductor plate layer. In some embodiments, the second contact via extends through second opening in the bottom conductor plate layer. In some examples, the semiconductor device may further include a third contact via electrically coupled to the bottom conductor plate layer and the top conductor plate layer, and electrically insulated from the middle conductor plate layer. In some instances, the third contact via extends through fourth opening in the middle conductor plate layer.

Another aspect of the present disclosure involves a semiconductor device. The semiconductor device includes a substrate, a dielectric layer over the substrate, and a metal-insulator-metal structure embedded in the dielectric layer. The metal-insulator-metal structure includes a bottom conductor plate layer having a first opening and a second opening, a first insulator layer over the bottom conductor plate layer, a middle conductor plate layer over the first insulator layer, where the middle conductor plate layer has a third opening, a first dummy plate disposed within the third opening, and a fourth opening, a second insulator layer over the middle conductor plate layer, and a top conductor plate layer over the second insulator layer. The top conductor plate layer includes a fifth opening, a second dummy plate disposed within the fifth opening, a sixth opening, and a third dummy plate disposed within the sixth opening. The first opening, the third opening, and the fifth opening are vertically aligned. A first vertical projection area of the fifth opening is greater than a second vertical projection area of the third opening. The second vertical projection area of the third opening is greater than a third vertical projection area of the first opening.

In some embodiments, the first dummy plate and the second dummy plate are vertically aligned and a fourth vertical projection area of the second dummy plate is greater than a fifth vertical projection area of the first dummy plate. In some implementations, the second opening and the sixth opening are vertically aligned and a sixth vertical projection area of the sixth opening is greater than a seventh vertical projection area of the second opening. In some instances, the first dummy plate is electrically insulated from the rest of the middle conductor plate layer, the second dummy plate is electrically insulated from the rest of the top conductor plate layer, and the third dummy plate is electrically insulated from the rest of the top conductor plate layer. In some implementations, the semiconductor device may further include a first contact via electrically coupled to the first dummy plate and the third dummy plate, and electrically insulated from the bottom conductor plate layer. In some embodiments, the semiconductor device may further include a second contact via electrically coupled to the third dummy plate and the middle conductor plate layer, and electrically insulated from the bottom conductor plate layer. In some implementations, the semiconductor device may further include a third contact via electrically coupled to the bottom conductor plate layer and the top conductor plate layer, and electrically insulated from the middle conductor plate layer.

Still another aspect of the present disclosure involves a method. The method includes depositing a first dielectric layer over a substrate, forming a metal-insulator-metal (MIM) structure over the first dielectric layer, and depositing a dielectric layer over the MIM structure. The forming of the MIM structure includes forming a bottom plate layer that includes a first opening and a second opening, depositing a first insulator layer over the bottom plate layer, forming a middle plate layer, depositing a second insulator layer over the middle plate layer, and forming a top plate layer. The middle plate layer includes a third opening vertically aligned with the first opening, and a first dummy plate disposed within the third opening. The top plate layer includes a fourth opening vertically aligned with the first opening and the third opening, a fifth opening vertically aligned with the second opening, a second dummy plate disposed within the fourth opening, and a third dummy plate disposed within the fifth opening.

In some embodiments, the method may further include forming a first via opening through the first opening, the first insulator layer, the third opening, the first dummy plate, the second insulator layer, the fourth opening, and the second dummy plate, and forming a second via opening through the second opening, the first insulator layer, the middle plate layer, the second insulator layer, the fifth opening, and the third dummy plate. In some embodiments, the fourth opening includes a first diameter, the third opening includes a second diameter smaller than the first diameter, and the first opening includes a third diameter smaller than the second diameter. In some implementations, the first dummy plate includes a fourth diameter and the second dummy plate includes a fifth diameter greater than the fourth diameter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a metal-insulator-metal (MIM) structure over a substrate, wherein the forming of the MIM structure comprises:
      forming a bottom plate layer that includes a first opening and a second opening,
      wherein the first opening and the second opening are separated from one another by a portion of the bottom plate layer;
      depositing a first insulator layer over the bottom plate layer;
      forming a middle plate layer that includes:
         a third opening vertically aligned with the first opening, and
         a first dummy plate disposed within the third opening;
      depositing a second insulator layer over the middle plate layer;
      forming a top plate layer that includes:
         a fourth opening vertically aligned with the first opening and the third opening,
         a fifth opening vertically aligned with the second opening, wherein the fifth opening and the fourth opening are separated from one another by a portion of the top plate layer,
         a second dummy plate disposed within the fourth opening, and
         a third dummy plate disposed within the fifth opening; and
   depositing a dielectric layer over the MIM structure.

2. The method of claim 1, further comprising:
   forming a first via opening through the first opening, the first insulator layer, the third opening, the first dummy plate, the second insulator layer, the fourth opening, and the second dummy plate; and
   forming a second via opening through the second opening, the first insulator layer, the middle plate layer, the second insulator layer, the fifth opening, and the third dummy plate.

3. The method of claim 1,
   wherein each of the first opening, the third opening and the fourth opening is substantially circular,
   wherein the fourth opening includes a first diameter,
   wherein the third opening includes a second diameter smaller than the first diameter,
   wherein the first opening includes a third diameter smaller than the second diameter.

4. The method of claim 1,
   wherein each of the first dummy plate and the second dummy plate is substantially circular,
   wherein the first dummy plate includes a fourth diameter,
   wherein the second dummy plate includes a fifth diameter greater than the fourth diameter.

5. The method of claim 1,
   wherein each of the second opening and the fifth opening is substantially circular,
   wherein the second opening comprises a sixth diameter,
   wherein the fifth opening comprises a seventh diameter greater than the sixth diameter.

6. The method of claim 1, wherein the bottom plate layer is free of any dummy plate.

7. The method of claim 1, wherein the first dummy plate is spaced apart and electrically insulated from the rest of the middle plate layer.

8. The method of claim 1, wherein the second dummy plate is spaced apart and electrically insulated from the rest of the top plate layer.

9. The method of claim 1, wherein the third dummy plate is spaced apart and electrically insulated from the rest of the top plate layer.

10. A method, comprising:
    forming a metal-insulator-metal (MIM) structure over a substrate, wherein the forming of the MIM structure comprises:
       forming a bottom conductor plate layer that includes a first opening and a second opening, wherein the first opening and the second opening are separated from one another by a portion of the bottom conductor plate layer;
       depositing a first insulator layer over the bottom conductor plate layer;
       forming a middle conductor plate layer that includes:
          a third opening vertically aligned with the first opening, and
          a first dummy plate disposed completely within the third opening;
       after the forming of the middle conductor plate layer, depositing a second insulator layer over the middle conductor plate layer, sidewalls and a top surface of the first dummy plate;
       forming a top conductor plate layer that includes:
          a fourth opening vertically aligned with the first opening and the third opening, and
          a second dummy plate disposed within the fourth opening; and
    depositing a dielectric layer over the MIM structure.

11. The method of claim 10, further comprising:
    forming a first via opening through the first opening, the first insulator layer, the third opening, the first dummy plate, the second insulator layer, the fourth opening, and the second dummy plate; and
    forming a first upper contact feature in the first via opening.

12. The method of claim 11, wherein the first upper contact feature comprises tapered sidewalls.

13. The method of claim 10, wherein the top conductor plate layer further comprises:
    a fifth opening vertically aligned with the second opening; and
    a third dummy plate disposed within the fifth opening,
    wherein the fifth opening and the fourth opening are separated from one another by a portion of the top conductor plate layer.

14. The method of claim 13, further comprising:
    forming a second via opening through the second opening, the first insulator layer, the middle conductor plate layer, the second insulator layer, the fifth opening, and the third dummy plate; and
    forming a second upper contact feature in the second via opening.

15. The method of claim 14, wherein the second upper contact feature comprises tapered sidewalls.

16. The method of claim 10,
    wherein each of the first opening, the third opening and the fourth opening is substantially circular,
    wherein the fourth opening includes a first diameter, wherein the third opening includes a second diameter smaller than the first diameter, wherein the first opening includes a third diameter smaller than the second diameter.

17. The method of claim 10, wherein each of the first dummy plate and the second dummy plate is substantially circular, wherein the first dummy plate includes a fourth diameter, wherein the second dummy plate includes a fifth diameter greater than the fourth diameter.

18. A method, comprising:

forming a bottom conductor plate layer that includes a first opening and a second opening, wherein the first opening is separated from the second opening by a portion of the bottom conductor plate layer;

depositing a first insulator layer over the bottom conductor plate layer;

forming a middle conductor plate layer that includes:
    a third opening vertically aligned with the first opening, and
    a first dummy plate disposed within the third opening;

depositing a second insulator layer over the middle conductor plate layer;

forming a top conductor plate layer that includes:
    a fourth opening vertically aligned with the first opening and the third opening,
    a fifth opening vertically aligned with the second opening, wherein the fourth opening is separated from the fifth opening by a portion of the top conductor plate layer,
    a second dummy plate disposed within the fourth opening, and
    a third dummy plate disposed within the fifth opening; and depositing a dielectric layer over the top conductor plate layer.

19. The method of claim 18, wherein the first dummy plate is spaced apart and electrically insulated from the rest of the middle conductor plate layer, wherein the second dummy plate is spaced apart and electrically insulated from the rest of the top conductor plate layer, and wherein the third dummy plate is spaced apart and electrically insulated from the rest of the top conductor plate layer.

20. The method of claim 18, wherein each of the first dummy plate and the second dummy plate is substantially circular, wherein the first dummy plate includes a first diameter, wherein the second dummy plate includes a second diameter greater than the first diameter.

* * * * *